(12) United States Patent
Stimson et al.

(10) Patent No.: US 10,158,115 B2
(45) Date of Patent: Dec. 18, 2018

(54) FLASH EVAPORATION OF SOLID STATE BATTERY COMPONENT

(71) Applicant: QUANTUMSCAPE CORPORATION, San Jose, CA (US)

(72) Inventors: Bradley O. Stimson, San Jose, CA (US); Weston A. Hermann, San Jose, CA (US); David E. Berkstresser, San Jose, CA (US); Tim Holme, San Jose, CA (US); Arnold Allenic, San Jose, CA (US)

(73) Assignee: QuantumScape Corporation, San Jose, CA (US)

( * ) Notice: Subject to any disclaimer, the term of this patent is extended or adjusted under 35 U.S.C. 154(b) by 407 days.

(21) Appl. No.: 14/785,840

(22) PCT Filed: Jun. 6, 2014

(86) PCT No.: PCT/US2014/041203
§ 371 (c)(1),
(2) Date: Oct. 20, 2015

(87) PCT Pub. No.: WO2014/197751
PCT Pub. Date: Dec. 11, 2014

(65) Prior Publication Data
US 2016/0093874 A1 Mar. 31, 2016

Related U.S. Application Data

(60) Provisional application No. 61/832,127, filed on Jun. 6, 2013.

(51) Int. Cl.
*H01M 4/04* (2006.01)
*C23C 14/24* (2006.01)
(Continued)

(52) U.S. Cl.
CPC ......... *H01M 4/0428* (2013.01); *B22F 1/0018* (2013.01); *B22F 9/28* (2013.01);
(Continued)

(58) Field of Classification Search
CPC ............... C23C 14/14; C23C 14/16; C23C 14/24–14/26; C23C 14/56–14/562; H01M 4/582; H01M 4/0423
See application file for complete search history.

(56) References Cited

U.S. PATENT DOCUMENTS 5,522,955 A * 6/1996 Brodd ............... C23C 14/16
156/182
5,945,163 A 8/1999 Powel et al.
(Continued)

OTHER PUBLICATIONS

Arai et al. "Cathode Performance and Voltage Estimation of Metal Trihalides", *Journal of Power Sources*, 1997, vol. 68, pp. 716-719.
(Continued)

*Primary Examiner* — Elizabeth A Burkhart
(74) *Attorney, Agent, or Firm* — Squire Patton Boggs (US) LLP

(57) ABSTRACT

In an example, the present invention provides a method for forming a film of material for a solid state battery or other energy storage device. The method includes providing a first precursor species, and providing a second precursor species. The method also includes transferring the first precursor species through a first nozzle and outputting the first precursor species in a first molecular form and transferring the second precursor species through a second nozzle and outputting the second precursor species in a second molecular form. The method includes causing formation of first plurality of particles, ranging from about first diameter to about a second diameter, by intermixing the first precursor species with the second precursor species. The method also
(Continued)

includes cooling the first plurality of particles at a rate of greater than 100° C./s to a specified temperature.

30 Claims, 17 Drawing Sheets

(51) Int. Cl.
<table>
<tr><td>C23C 14/14</td><td>(2006.01)</td></tr>
<tr><td>C23C 14/26</td><td>(2006.01)</td></tr>
<tr><td>C23C 14/56</td><td>(2006.01)</td></tr>
<tr><td>B22F 1/00</td><td>(2006.01)</td></tr>
<tr><td>B22F 9/28</td><td>(2006.01)</td></tr>
<tr><td>H01M 4/58</td><td>(2010.01)</td></tr>
<tr><td>H01M 4/139</td><td>(2010.01)</td></tr>
</table>

(52) U.S. Cl.
CPC .............. *C23C 14/14* (2013.01); *C23C 14/24* (2013.01); *C23C 14/26* (2013.01); *C23C 14/562* (2013.01); *H01M 4/582* (2013.01); *B22F 2999/00* (2013.01); *H01M 4/139* (2013.01)

(56) References Cited

U.S. PATENT DOCUMENTS

<table>
<tr><td>6,037,241</td><td>A</td><td>3/2000</td><td>Powell et al.</td><td></td></tr>
<tr><td>6,635,114</td><td>B2*</td><td>10/2003</td><td>Zhao</td><td>C23C 16/4402<br>118/715</td></tr>
<tr><td>6,719,848</td><td>B2</td><td>4/2004</td><td>Faykosh et al.</td><td></td></tr>
<tr><td>7,371,338</td><td>B2</td><td>5/2008</td><td>Amatucci</td><td></td></tr>
<tr><td>7,625,671</td><td>B2</td><td>12/2009</td><td>Amatucci</td><td></td></tr>
<tr><td>7,780,787</td><td>B2</td><td>8/2010</td><td>Nolan</td><td></td></tr>
<tr><td>7,910,166</td><td>B2</td><td>3/2011</td><td>Powell et al.</td><td></td></tr>
<tr><td>7,927,659</td><td>B2</td><td>4/2011</td><td>Powell et al.</td><td></td></tr>
<tr><td>7,931,937</td><td>B2</td><td>4/2011</td><td>Powell et al.</td><td></td></tr>
<tr><td>7,947,392</td><td>B2</td><td>5/2011</td><td>Amatucci et al.</td><td></td></tr>
<tr><td>7,968,145</td><td>B2</td><td>6/2011</td><td>Powell et al.</td><td></td></tr>
<tr><td>8,951,668</td><td>B2</td><td>2/2015</td><td>Pereira et al.</td><td></td></tr>
<tr><td>9,065,137</td><td>B2</td><td>6/2015</td><td>Amatucci et al.</td><td></td></tr>
<tr><td>2004/0121235</td><td>A1*</td><td>6/2004</td><td>Amatucci</td><td>H01M 4/136<br>429/231.95</td></tr>
<tr><td>2007/0007109</td><td>A1</td><td>1/2007</td><td>Powell et al.</td><td></td></tr>
<tr><td>2007/0134427</td><td>A1*</td><td>6/2007</td><td>Kalynushkin</td><td>C23C 14/08<br>427/398.1</td></tr>
<tr><td>2007/0237894</td><td>A1</td><td>10/2007</td><td>Powell</td><td></td></tr>
<tr><td>2008/0044571</td><td>A1</td><td>2/2008</td><td>Maltby</td><td></td></tr>
<tr><td>2009/0246940</td><td>A1</td><td>10/2009</td><td>Powell</td><td></td></tr>
<tr><td>2010/0210059</td><td>A1</td><td>8/2010</td><td>Milshtein</td><td></td></tr>
<tr><td>2011/0039401</td><td>A1</td><td>2/2011</td><td>Nolan</td><td></td></tr>
<tr><td>2011/0045206</td><td>A1*</td><td>2/2011</td><td>Shang</td><td>H01M 4/0419<br>427/576</td></tr>
<tr><td>2011/0132261</td><td>A1</td><td>6/2011</td><td>Powell et al.</td><td></td></tr>
<tr><td>2011/0132262</td><td>A1</td><td>6/2011</td><td>Powell et al.</td><td></td></tr>
<tr><td>2011/0132263</td><td>A1</td><td>6/2011</td><td>Powell et al.</td><td></td></tr>
<tr><td>2014/0087092</td><td>A1*</td><td>3/2014</td><td>Nieh</td><td>H01J 37/32422<br>427/569</td></tr>
</table>

OTHER PUBLICATIONS

Liao et al. "Combinatorially Prepared $[LiF]_{1-x}Fe_x$ Nanocomposites for Positive Electrode Materials in Li-Ion Batteries", *Chem. Mater.*, 2008, vol. 20, No. 2, pp. 454-461.

Kestner et al. "An Experimental and Modeling Analysis of Vapor Transport Deposition of Cadmium Telluride", *Solar Energy Materials & Solar Cells*, 2004, vol. 83, pp. 55-65.

Badway et al. "Carbon Metal Fluoride Nanocomposites, High-Capacity Reversible Metal Fluoride Conversion Materials as Rechargeable Positive Electrodes for Li Batteries", *Journal of the Electrochemical Society*, 2003, vol. 150, No. 10, pp. A1318-A1327.

Kita et al. "Magnetic Properties of Fe/fluorides ($CaF_2$, LiF) Multilayered Thin Films", *Journal of Magnetism and Magnetic Materials*, 1992, vol. 117, pp. 294-300, North-Holland.

Plitz et al. "Structure and Electrochemistry of Carbon-Metal Fluoride Nanocomposites Fabricated by Solid-State Redox Conversion Reaction", *Journal of the Electrochemical Society*, 2005, vol. 152, No. 2, pp. A307-A315.

Ochi et al. "Interface Mixing in Fe/LiF Multilayered Thin Film", *Journal of the Physical Society of Japan*, Jan. 1992, vol. 61, No. 1, pp. 35-38.

* cited by examiner

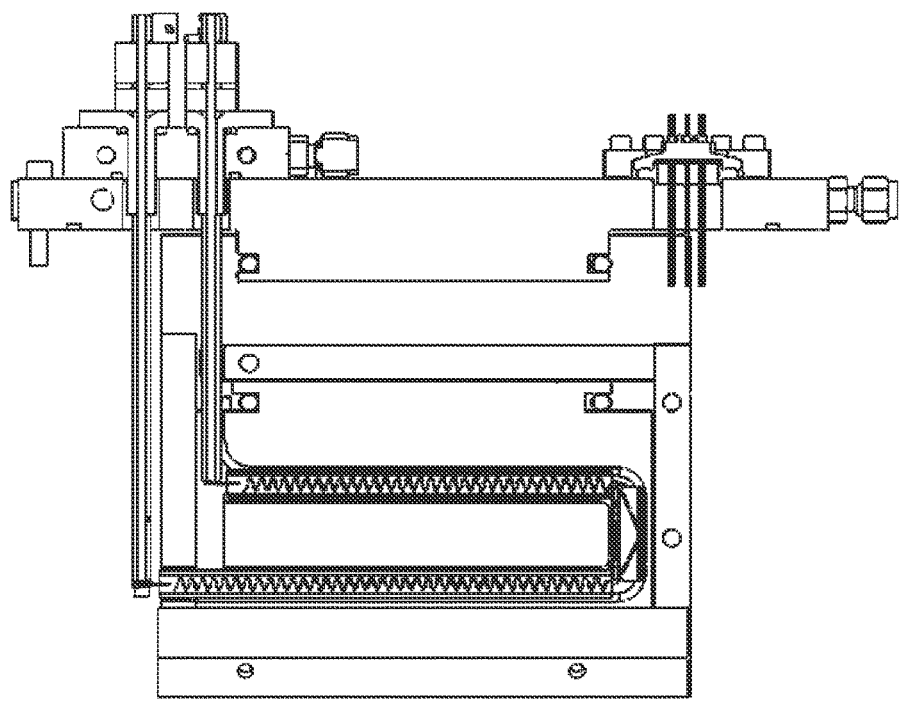
FIG. 5

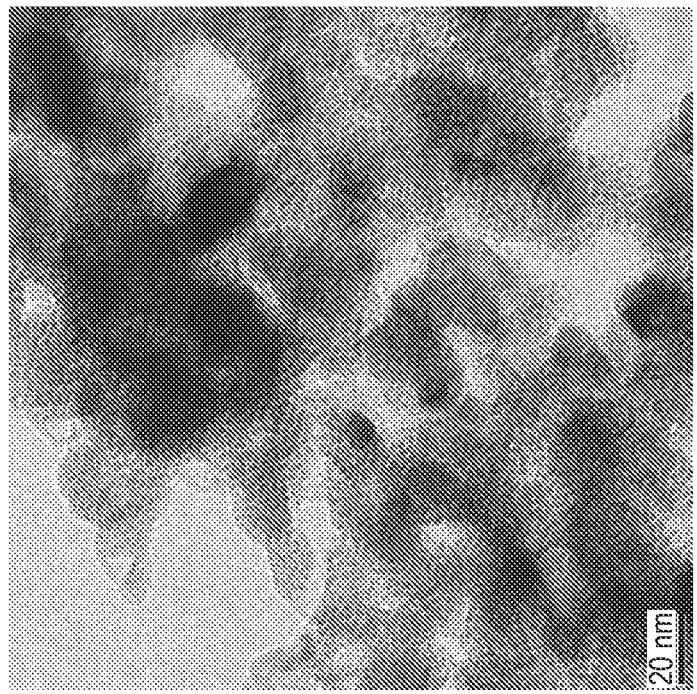
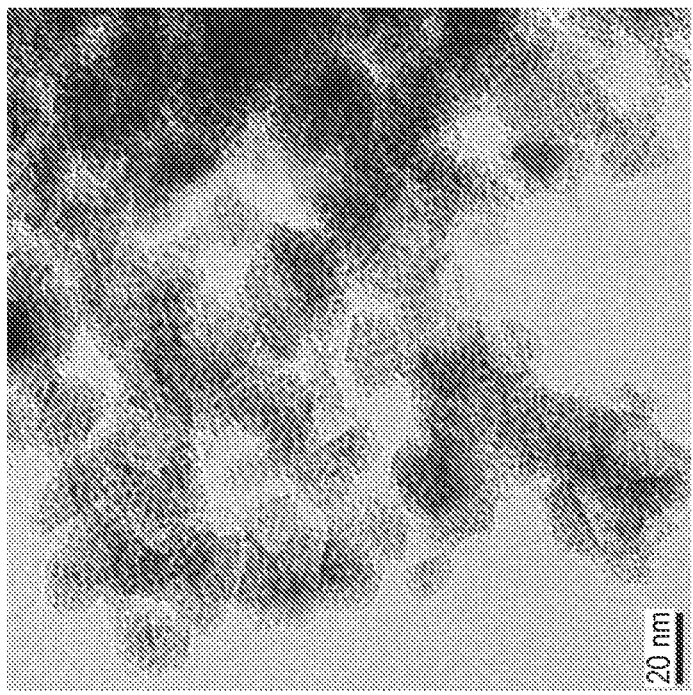
FIG. 10

FLASH EVAPORATION OF SOLID STATE BATTERY COMPONENT

CROSS-REFERENCE TO RELATED APPLICATIONS

This application claims priority to International PCT Patent Application No. PCT/US2014/041203, filed Jun. 6, 2014, and to U.S. Provisional Patent Application No. 61/832,127, filed Jun. 6, 2013, the entire contents of each patent application are herein incorporated by reference in their entirety for all purposes.

BACKGROUND

The present invention relates generally to solid-state battery techniques. In particular, the present invention provides techniques for manufacturing a cathode, a catholyte, an electrolyte, or combination thereof, material having a desired ion conductivity. More particularly, the present invention provides an apparatus and method for the formation of a plurality of nanodimensioned particles with a selected composition that is useful for making cathode, catholyte, electrolyte, or combination thereof, materials to improve the ionic conductivity, for example, in a solid state battery. Merely by way of example, the invention has been applied to solid-state battery cells, although there can be other applications.

A high level of development has occurred in electronic and communication apparatuses. As an example, certain apparatus include, among others, a personal computer, a video camera and a portable telephone, commonly termed a "smart phone." Examples of popular smart phones include the iPhone™ from Apple Inc. of Cupertino, Calif. or those phones using the Android™ operating system of Google Inc. in Mountain View, Calif. Other popular apparatus include electric or hybrid automobiles such as those from Tesla Motors Inc. in Fremont, Calif. or the Prius manufactured by Toyota Motor Corporation. Although highly successful, these popular apparatuses are limited by storage capacity and in particular battery capacity. A lithium battery has been presently noticed with regard to having a high energy density and with respect to various kinds of batteries. However, certain problems in the production of lithium batteries exist.

Liquid electrolytes containing a flammable organic solvents have been used for conventional lithium batteries. Unfortunately, lithium batteries often require a safety device for restraining a temperature rise in the battery which can be caused by a short circuit. A lithium battery configured with a solid electrolyte layer, which replaces the liquid electrolyte, has been described to improve the safety of lithium batteries and the devices which incorporate them. For example, a sulfide-based solid electrolyte material is known as a solid electrolyte material useful for a solid-state lithium battery.

Techniques for improving the production of solid-state batteries, as well as for the constituent components thereof, are still needed.

A challenge associated with the field to which the methods and systems described herein relate is the potentially slow mass transfer of lithium ions through a cathode active material having a metal halide or a lithium fluoride matrix, which may be in the form of particles. As a consequence, the full capacity of a battery incorporating these materials is not realized because many reactive sites are inaccessible in a period of time required for charging or discharging the battery in certain applications. Further, the rate performance of these material can be relatively poor given that the diffusion and migration time of lithium ions through the matrix takes long a time. Still further, a significant mass transport overpotential is associated with charging and discharging these materials. This overpotential results in lower energy delivered to the application, more heat generation, which can cause problems at a systems level, and lower efficiency, which increases the cost to the consumer. This challenge may also exist in batteries employing conversion materials with metal species other than iron, oxidizing species other than fluoride, and/or reducing cation species other than lithium ions.

To address the challenge of slow mass transport, the methods and apparatuses set forth herein provide, for example, for the manufacture of positive electrode nanodimensioned materials that contains elemental metal or an alloy thereof and a lithium compound (in the discharged state) or a metal compound (in the charged state) and which may be provided in the form of extremely small particles. In doing so, the methods, systems, and apparatuses set forth herein, surprisingly provide, inter alia, solutions to many of the aforementioned challenges.

SUMMARY OF INVENTION

The small constituent separation distances in the materials made by the methods set forth herein provide a relatively short diffusion path for the lithium or other electropositive ions to move from the outside of the cathode active particle to the reactive metal compound sites within the particle (discharge) or from a lithium compound within the particle to the particle surface (charge). During charge, for example, lithium ions must leave lithium fluoride and transport to the exterior of the particle where they contact the electrolyte. After leaving a particle, a lithium ion may contact other ion conductive matrix elements in the electrode before reaching the electrolyte. Conversely, on discharge lithium ions undergo a journey from the electrolyte into the body of the electrode where they must travel some distance before reaching a destination particle, which they enter and pass into before finding a reactive metal compound site. After this multistage transport, the lithium ion can participate in a redox reaction to generate electrochemical energy (discharge). The reverse path is traversed during charge. The use of small separation distances of active material permits the positive electrode to operate with improved rate performance, not available previously.

A further benefit that could be achieved by extremely small constituent separation distances, in the materials made by the methods and systems set forth herein, is the comparatively shorter diffusion distance between the metal atom and the anion. As the metal and anion atoms are larger and more massive, their transport is generally slower than that of lithium. In some examples, described below, the provided nanostructure puts metal atoms in close proximity to anions, reducing the distance they must diffuse.

An additional challenge to realizing the potential benefits of conversion materials arises from the high surface area/mass ratio of very small particles. In some examples, the large surface area (as a function of the mass of reactive material) results in a relatively large fraction of the active material converting to a solid electrolyte interface (SEI) layer, which extracts much of the available lithium and presents it in an unusable form. This also can result in a relatively short cycle life as the SEI layer may continue to grow in subsequent cycles. The SEI that forms around a particle which undergoes significant volume changes during cycling may sometimes crack, providing a fresh surface that is then covered by a SEI. The growing SEI contains mass that does not contribute to the energy stored in the battery, and may present a barrier to lithium transport, reducing the rate performance of the battery.

According to one embodiment of the present invention, disclosed herein is a method for forming a nanodimensioned or nanodomained material, the method including: providing a lithium precursor species; providing a transition metal precursor species; optionally heating and optionally filtering either or both of the precursor species to generate a vapor of each the precursor species; transferring through at least one nozzle the lithium precursor species into a process region; transferring through the at least one nozzle, or an optional second nozzle, the transition metal precursor species into the process region; intermixing the precursor species in the process region to form an intermixture; and cooling the intermixture at a rate between about 100° C./s to about 2000° C./S by depositing the intermixture on a substrate; thereby forming a nanodimensioned material. In some examples, the nanodimensioned material includes Li, F, and Fe, and is substantially amorphous with nanodimensioned grains. In other examples, the nanodimensioned material includes Li, F, and Ni, or Li, F and Cu, or Li, F and Co or Li, F and Mn, or combinations thereof. In some of these examples, the nozzle is substituted with an aperture.

According to a second embodiment of the present invention, techniques related a manufacture of solid-state battery components having a desired ion conductivity are provided. In particular, the present invention provides techniques, including an apparatus and method for manufacturing cathode active material. More particularly, an embodiment of the present invention provides an apparatus and method for forming a plurality of particles with a selected composition that is useful for making active materials for improve the energy density and/or power density of electrochemical devices using these particles. Merely by way of example, the invention has been applied to solid state battery cells, although there can be other applications.

According to a third embodiment of the present invention, disclosed herein is a deposition apparatus for forming a nanodimensioned or nanodomained material, the apparatus including a source of a lithium precursor species; a source of a transition metal precursor species; at least one nozzle coupled to the lithium precursor source and configured for outputting the precursor species in a vapor form; optionally a second nozzle coupled to the transition metal precursor source and configured for outputting the transition metal precursor source in a vapor form; a process region coupled to the at least one nozzle and the optional second nozzle and configured to intermix the precursor species; and a thermal sink provided in the process region selected from a cooled substrate or rotating drum, and configured for cooling the vapors in the process region at a rate between about 100° C./s to about 2000° C./S. In some examples, the apparatus includes an inductive or a radiative heating element and a filtering element for heating the precursor species into the vapor phrase and for filtering the heated precursor specie so that only the vapor phrase of the precursor specie is transferred into the process region. In some of these examples, the nozzle is substituted with an aperture.

According to a third embodiment of the present invention, disclosed herein is a deposition apparatus for forming a nanodimensioned or nanodomained material, the apparatus including a source of a lithium precursor species; a source of a transition metal precursor species; at least one nozzle coupled to the lithium precursor source and configured for outputting the precursor species in a vapor form; optionally a second nozzle coupled to the transition metal precursor source and configured for outputting the transition metal precursor source in a vapor form; a process region coupled to the at least one nozzle and the optional second nozzle and configured to intermix the precursor species; and a thermal sink provided in the process region selected from a cooled substrate or rotating drum, and configured for cooling the vapors in the process region at a rate between about 100° C./s to about 2000° C./S. In some examples, the apparatus includes an inductive or a radiative heating element and a filtering element for heating the precursor species into the vapor phrase and for filtering the heated precursor specie so that only the vapor phrase of the precursor specie is transferred into the process region. In some of these examples, the nozzle is substituted with an aperture.

According to a fourth embodiment of the present invention, disclosed herein is a deposition apparatus for forming a nanodimensioned or nanodomained material, the apparatus including a source that includes a mixture of a lithium precursor species and a transition metal precursor species; at least one nozzle coupled to the mixture of a lithium precursor species and a transition metal precursor species and configured for outputting the precursor species mixture in a vapor form; a process region coupled to the at least one nozzle; and a thermal sink provided in the process region selected from a cooled substrate, roll to roll foil, or rotating drum, and configured for cooling the vapors in the process region at a rate between about 100° C./s to about 2000° C./S. In some examples, the apparatus includes an inductive or a radiative heating element and a filtering element for heating the mixture of a lithium precursor species and a transition metal precursor species into the vapor phrase and for filtering the heated mixture so that only the vapor phase of the precursor specie is transferred into the process region. In some of these examples, the nozzle is substituted with an aperture.

In a fifth embodiment, the present invention provides a method for forming a film of material for a solid state battery or other energy storage device. The method includes providing a first precursor species and providing a second precursor species.

In certain examples, the methods disclosed herein also include transferring the first precursor species through a first nozzle and outputting the first precursor species in a first molecular form and transferring the second precursor species through a second nozzle and outputting the second precursor species in a second molecular form. The method includes causing formation of first plurality of particles, ranging from about first diameter to about a second diameter, by intermixing the first precursor species with the second precursor species. The method also includes cooling the first plurality of particles at a rate of greater than 100° C./s to a specified temperature.

In an example, the invention provides a deposition apparatus for forming a film of material for a solid state battery. The apparatus has a first source configured for a first precursor species and a second source configured for a second precursor species. The apparatus has a first nozzle coupled to the first source and configured for outputting the first precursor species in a first molecular form and a second nozzle coupled to the second source and configured for outputting the second precursor species in a second molecular form. Certain apparatuses set forth herein include a process region coupled to the first nozzle and the second nozzle and configured to cause formation of first plurality of particles, ranging from about first diameter to about a second diameter, by intermixing the first precursor species with the second precursor species. These apparatus have a thermal sink provided in the process region, and configured for cooling the first plurality of particles at a rate of greater than 100° C./s to a specified temperature. In some of these examples, the nozzle is substituted with an aperture.

In an example, the intermixing is provided in a process region, e.g., chamber. In an example, the process region is a vacuum environment or a predetermined environment. In an example, the process region comprises a carrier gas, e.g., nitrogen, argon, or other inert species or combination thereof. In an example, the method further subjects the first precursor species to a thermal process to preheat the precursor species, e.g., a lithium, iron or fluorine, or compounds thereof.

In an example, the method includes subjecting the second precursor species to a thermal process to preheat the precursor species. In an example, the method includes subjecting the first precursor species to a filter process, e.g., mechanical, electrical, magnetic, chemical, gravitational. In an example, the method includes subjecting the second precursor species to a filter process. In an example, the first nozzle and the second nozzle is formed in a concatenated configuration. In an example, the method includes forming a thickness of the first plurality of particles on a substrate member. In an example, the method includes forming a thickness of the first plurality of particles a movable substrate member configured on a roll to roll. In some examples, the substrate is a rotating drum. In some other examples, the rotating drum is cooled. In an example, the first precursor species is a nickel or a nickel and fluoride species. In an example, the first precursor species is a copper or a copper and fluoride species. In an example, the first precursor species is a cobalt or a cobalt and fluoride species. In an example, the first precursor species is an iron or an iron and fluoride species. In an example, the first precursor species is a manganese or a manganese and fluoride species.

In any of the examples described herein, the apparatus may further include an inductive or a radiative heating element and a filtering element for heating a mixture of a lithium precursor species and a transition metal precursor species into the vapor phrase and for filtering the heated vapor mixture so that only the vapor phase of the precursor specie is transferred into a process region and onto a substrate where the vapors condense and are deposited.

In an example, the second precursor species is a lithium species or a lithium and fluoride species. In an example, the plurality of particles are each homogeneous in composition. In an example, the first nozzle is connected to a first tube structure; and wherein the second nozzle is connected to a second tube structure. In an example, the first tube structure is maintained at a temperature of 1000 to 2000 Degrees Celsius. In an example, the second tube structure is maintained at a temperature of 1000 to 2000 Degrees Celsius. In an example, the method uses the plurality of second particles for a manufacture of an energy cell. In an example, the intermixing is provided in a process region at a temperature of about 1000 to 2000 Degrees Celsius. In an example, the method includes subjecting the first plurality of particles to a mechanical process to form a plurality of second particles ranging in diameter from a first diameter to a second diameter. In an example, the plurality of first particles comprise a lithium, a metal or a fluorine species where the metal may be nickel, copper, iron, cobalt, manganese, or a combination thereof. In an example, the plurality of second particles comprise a lithium, a metal or a fluorine species where the metal may be nickel, copper, iron, cobalt, manganese, or a combination thereof. In an example, the first nozzle is fed at a specified mass flow rate. In an example, the second nozzle is fed at a specified mass flow rate.

In an example, the present invention provides a deposition apparatus for forming a film of material. The apparatus has a first source configured for a first precursor species and a second source configured for a second precursor species, which are among a plurality of sources. The apparatus has a nozzle coupled to the first source and the nozzle coupled to the second source. The apparatus has a process region coupled to the nozzle and configured to cause formation of first plurality of particles, ranging from about first diameter to about a second diameter, by an intermixed first precursor species with the second precursor species. The apparatus has a thermal sink provided in the process region, and configured for cooling the first plurality of particles at a rate of greater than 100° C./s to a specified temperature. Further details of the present apparatus can be found throughout the present specification and more particularly below.

The present invention achieves these aforementioned benefits and others in the context of known process technology. However, a further understanding of the nature and advantages of the present invention may be realized by reference to the latter portions of the specification and attached drawings.

BRIEF DESCRIPTION OF THE DRAWINGS

FIG. 5 shows a side view of an example of a deposition apparatus according to an embodiment of the present invention.

FIG. 10 shows an example of a nanodimensioned material, having nanodomains of $FeF_2$ (dark areas) surrounded by a LiF matrix (light areas), made by an embodiment of the present invention.

DETAILED DESCRIPTION OF THE SPECIFIC EMBODIMENTS

Figure 1A:
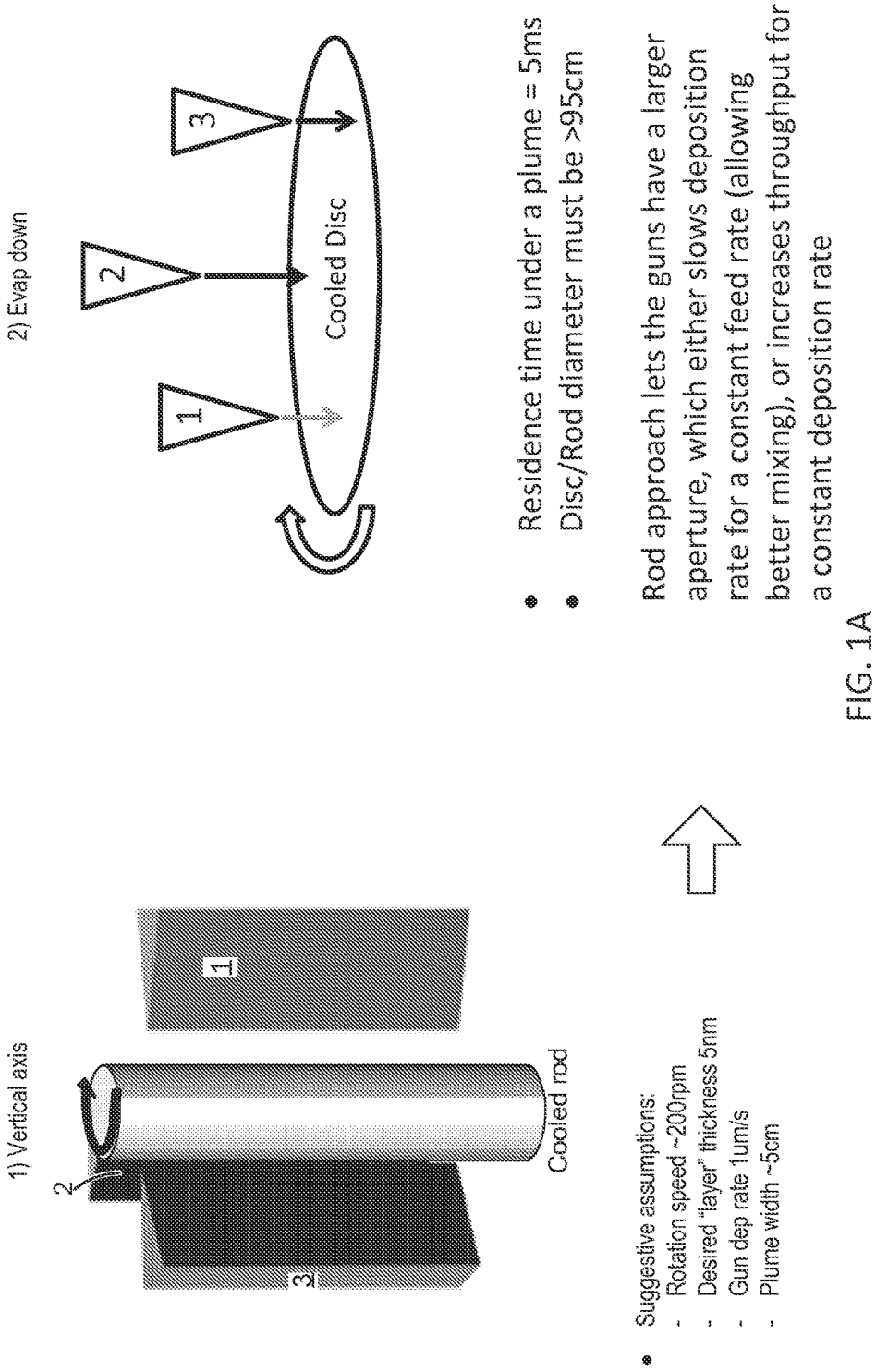
FIG. 1 illustrates deposition techniques, including vertical deposition on cylinder, and flat substrate deposition, according to an embodiment of the present invention.

According to an example of the present invention, techniques related a manufacture of solid-state battery components having desired energy density are provided. In particular, the present invention provides techniques for manufacturing a cathode active material having a desired reactivity. More particularly, the present invention provides an apparatus and method for the formation of a plurality of particles with a selected composition that is useful for making a cathode material to improve the intermixing of elements to a desired level. Merely by way of example, the invention has been applied to solid state battery cells, although there can be other applications.

In one example, the present invention provides for the manufacture particles that are a mixture of LiF and a transition metal such as Cu, Ni, Co, Mn, and/or Fe. In certain examples, the manufactured particles include LiF and transition metal which are mixed at the nanoscale or even at the molecular/atomic level. In some of these examples, there are about three (3) LiF molecules for every one Fe atom. In certain of these examples, there are three (3) LiF molecules for every one Co atom, or 2 LiF molecules for every Ni atom, or 2 LiF molecules for every Cu atom, or 3 LiF molecules for every Mn atom. This stoichiometry forms a fully lithiated cathode material with enough lithium so that no additional lithium needs to be added to the final cell. Some of the methods set forth herein, include post milling of the manufactured particles so that the final mean particle diameter of the manufactured particles is smaller than 1 um.

In some examples, the molar ratio of a Li precursor species to a Fe precursor specie is about 3 to 1. In some other examples, the Li precursor species includes fluorine and the molar ratio of fluorine to the Fe precursor specie is about 3 to 1. In some other examples, the molar ratio of a Li precursor species to a Ni precursor specie is about 3 to 1 or about 2 to 1. In certain examples, the molar ratio of a Li precursor species to a Ni precursor specie is 2 to 1. In some other examples, the Li precursor species includes fluorine and the molar ratio of fluorine to the Ni precursor specie is about 2 to 1. In some other examples, the molar ratio of a Li precursor species to a Cu precursor specie is about 3 to 1 or about 2 to 1. In certain examples, the molar ratio of a Li precursor species to a Cu precursor specie is 2 to 1. In some other examples, the Li precursor species includes fluorine and the molar ratio of fluorine to the Cu precursor specie is about 2 to 1.

In certain example set forth herein, disclosed herein are at least two approaches for making the particles. In one approach, the precursors can be mixed together as a powder or pellet and flash evaporated in one chamber (gun). In another approach, multiple guns can flash evaporate each precursor separately. In certain examples, the single gun operates at a temperature that will evaporate the lowest vapor pressure material (or highest melting temperature material).

In an alternative example, the present techniques use several combinations of materials (precursors) to accomplish the formation of nanodimensioned materials. First, Fe and LiF are suitable because they are cheap and available. Fe melts at a very high temperature (1550 Deg C) while LiF melts at a relatively lower temperature (845 Deg C). In one example set forth herein, a flash evaporator temperature operates in the range of 1600 to 2000° C. In some other examples, the flash evaporator operates in the range of 1000 to 2500° C.

In some examples, the final operating temperature is determined by the vapor pressure of the element at the operating pressure and the distance to the drum.

In some examples, LiF and $FeF_2$ are mixed together and the mixture is flash evaporated according to the methods set forth herein. In some other examples, LiF, $FeF_2$, and Li are mixed together and the mixture is flash evaporated according to the methods set forth herein. In yet other examples, LiF, $FeF_2$, and $FeF_3$ are mixed together and the mixture is flash evaporated according to the methods set forth herein. In still other examples, Li and Fe are mixed together and the mixture is flash evaporated according to the methods set forth herein.

In some examples, LiF and Ni are mixed together and the mixture is flash evaporated according to the methods set forth herein. In some examples, LiF and Cu are mixed together and the mixture is flash evaporated according to the methods set forth herein. In some examples, LiF and Co are mixed together and the mixture is flash evaporated according to the methods set forth herein. In some examples, LiF and Mn are mixed together and the mixture is flash evaporated according to the methods set forth herein. In some examples, LiF and $CoF_2$ are mixed together and the mixture is flash evaporated according to the methods set forth herein. In some examples, LiF and $MnF_2$ are mixed together and the mixture is flash evaporated according to the methods set forth herein.

I. Definitions

As used herein, the phrase "flash evaporation" refers to the process whereby precursor chemicals are heated, typically under a reduced pressure or vacuum atmosphere, to vaporize the precursor chemicals. The vaporized precursor chemicals are then transferred into a process region, through a nozzle or aperture that regulates gas flow, where the evaporated vapors can subsequently react and condense on a substrate.

As used herein, the phrase "nanodimensioned" refers to a composite material wherein the constituent components are separated by nanodimensions. For example, a nanodimensioned composite material may include a Li-containing compound, e.g., LiF, and an Fe-containing compound, e.g., Fe, wherein the domains of Fe and the domains of LiF have median physical dimensions of approximately 1-100 nm, or 2-50 nm, or 1-10 nm, or 2-5 nm, or 5-15 nm, or 5-20 nm, or the like as measured in a TEM micrograph by identification of regions of visual contrast of different nanodomains.

As used herein, the phrase "providing" refers to the provision of, generation or, presentation of, or delivery of that which is provided. Providing includes making something available. For example, providing LiF refers to the process of making LiF available, or delivering LiF, such that LiF can be used as set forth in a method described herein.

As used herein, the phrase "filtering" refers, for example, to a process whereby gases or vapors are separated from the solids or liquids from which the gases or vapors evaporate. Filtering includes, for example, passing vapors through a porous material, having micron sized pores (pores with mean pore diameters of about 1-100 µm) such that the vapors pass through the porous filter but the solid or liquid does not pass through the porous filter.

As used herein, the phrase "intermixing," refers to the mixing of one of more chemical species to form a mixture. Intermixing LiF and $FeF_2$ vapors refers to the process whereby LiF vapors and $FeF_2$ vapors are mixed to form a vapor that comprises both LiF and $FeF_2$ in a homogenously mixed vapor phase.

As used herein, the phrase "laminating" refers to the process of sequentially depositing a vapor layer of one precursor specie, e.g., a lithium precursor specie, onto a deposition substrate and then subsequently depositing an additional vapor layer onto an already deposited layer using a vapor of a second precursor specie, e.g., a transition metal precursor specie. This laminating process can be repeated to build up several layers of deposited vapor phases.

As used herein, the term "substantially amorphous" refers to a material that is primarily amorphous or that is characterized as having more amorphous components than crystalline components. Substantially amorphous refers to a material that does not include well defined x-ray diffraction peaks or that is characterized by an x-ray diffraction pattern that includes broad reflections that are recognized by a person having ordinary skill in the art as having the majority constituent component phase as an amorphous phase. A material that is substantially amorphous may have a nano-sized domains of crystallinity but which is still characterized by an x-ray diffraction pattern to be primarily in an amorphous phase. In a substantially amorphous material, TEM SADP may identify regions of crystallinity but would identify a majority of the volume of the material as amorphous.

As used herein, the term "process region" refers to a physical space in a flash evaporation apparatus wherein precursor vapors are mixed prior to being deposited on a substrate. In some examples, the process region is under a reduced pressure or is under vacuum conditions. In some examples, the process region is under a reduced pressure or is under vacuum conditions when the precursor vapors are introduced therein.

As used herein, the phrase "foil on a roll to roll mechanism" refers to a substrate of a metal foil, e.g., Ni or Al foil, which is movable. In an example, the movable metal foil is actually moved by contacting rollers which move the foil in the direction that the rollers rotate.

As used herein, the phrase "actively cooled" refers to a process whereby a surface is cooled through the action of one or more cooling mechanism. For example, energy is used in order to cool or lower the temperature of the actively cooled surface. For example, in a typical air-conditioning configuration, energy is used to flow Freon, or ammonia, through coils wherein the Freon or ammonia evaporates from a liquid into a gas and thereby actively cool the coils through which the Freon or ammonia flows. These cooled coils then, in turn, cool a surface to which the coils make contact. For example, circulating water, flowing gases or air, or a thermoelectric can be configured to contact a surface in such a way as to remove heat energy from the actively cooled surface such that the actively cooled surface's temperature is lowered to a temperature that is lower than the surface would be in the absence of the actively cooled mechanism.

As used herein the term "aperture" refers to a hole or small opening through which a chemical, or chemical vapor, can be transferred or transmitted. In some examples, the aperture is a nozzle which regulates or controls the flow of the chemical, chemical vapor, or gas that is transferred. In some examples, the aperture can be closed to maintain a pressure differential on opposing sides of the aperture. For example, the aperture can be closed to maintain a reduced pressure, or vacuum, on one side of the aperture while maintaining a positive pressure on the opposite side of the aperture. In some examples, the aperture is a nozzle that can be opened or closed to allow for a chemical precursor vapor to transfer controllably through the nozzle and into, for example, a process region.

I. Precursor Chemicals Suitable for Use with the Systems and Methods Set Forth Herein In some examples set forth herein, the systems, apparatus, and methods are suitable for use with precursor chemicals that can be flash evaporated and include metal species, M, which include, for example, transition metals, aluminum, and bismuth. In some examples, the metal is selected from the first row of transition metals. Certain examples of transition metals that may be used include, for example, bismuth (Bi), aluminum (Al), vanadium (V), chromium (Cr), copper (Cu), iron (Fe), cobalt (Co), manganese (Mn), nickel (Ni), ruthenium (Ru), titanium (Ti), silver (Ag), molybdenum (Mo), and tungsten (W). In certain examples, the metal component is selected from iron (Fe), copper (Cu), manganese (Mn), and cobalt (Co). In a certain embodiments, the metal component is iron (Fe). In some embodiments, the metal component is copper (Cu). In some embodiments, the metal component is cobalt (Co). In some embodiments, the metal component is manganese (Mn). In some embodiments, the metal component is nickel (Ni). In some of these examples, the iron is provided as iron fluoride, e.g., $FeF_2$. In some examples, the nickel is provided as nickel fluoride. In some examples, the copper is provided as copper fluoride. In some of these examples, the iron is provided as an iron halide. In some examples, the nickel is provided as a nickel halide. In some examples, the copper is provided as a copper halide.

In some examples, the first precursor or second precursor material is selected from the group consisting of iron (Fe), lithium fluoride (LiF), ferric fluoride ($FeF_3$), and ferrous fluoride ($FeF_2$). In other examples, either the first or second precursor material is selected from a metal. In other examples, the precursor includes lithium metal, lithium fluoride, or a lithium halide.

In some examples, eutectic mixtures of any of the precursor species set forth herein may be used. In some of these examples, the eutectic mixtures are heated, filtered, and transferred through a single nozzle into the process region.

II. Example Materials Made Using the Systems and Methods Set Forth Herein

In general, intercalation and/or conversion materials can be used in battery systems. For example, a positive electrode material may be used for intercalation or conversion with lithium. Intercalation materials, which can be prepared at a macro scale or at a nano scale, are commonly used in and typically have relatively low energy density (e.g., less than about 800 Wh/kg of active material). Conversion materials, in contrast, can provide much higher energy density (e.g., about 1000-2500 Wh/kg of active material). Battery systems and structures utilizing conversion material are described in U.S. Provisional Patent Application No. 61/778,455, filed 13 Mar. 2013, titled "IRON, FLUORINE, SULFUR COMPOUNDS FOR BATTERY CELL POSITIVE ELECTRODES", and U.S. Provisional Patent Application No. 61/674,961, filed Jul. 24, 2012, and titled "NANOSCALE LITHIUM COMPOUND AND METAL ELECTRODES", both of which are incorporated by reference herein in their entireties.

In certain embodiments, the conversion material includes an oxidizing species, a reducing cation species, and a metal species. These species are sometimes referred to herein as constituents or components. The oxidizing species is typically a strongly electronegative element, compound, or anion. Examples of oxidizing species anions include halides (fluorides, chlorides, bromides, and iodides), oxides, sulfides, and the like. The reducing cation species is typically an electropositive element or cation such as lithium, sodium, potassium, or magnesium. The metal species is typically less electropositive than the reducing cation species. Transition metals are sometimes used as the metal species. Examples include cobalt, copper, nickel, manganese, and iron. The conversion material may contain two or more oxidizing species, two or more reducing cation species, and/or two or more metal species.

Some example materials suitable as nanodimensioned materials useful with embodiments of the present invention include charged state positive electrode materials including sulfides, oxides, halides, phosphides, nitrides, chalcogenides, oxysulfides, oxyfluorides, sulfur-fluorides, and sulfur-oxyfluorides. In various embodiments, these charged conversion material include one or more of the following: $AgF$; $AlF_3$; $BiF_3$; $B_2O_3$; $Co_3O_4$; $CoO$; $CoS_2$; $Co_{0.92}S$; $Co_3S_4$; $Co_9S_8$; $CoN$; $Co_3N$; $CoP_3$; $CoF_2$; $CoF_3$; $Cr_2O_3$; $Cr_3O_4$; $CrS$; $CrN$; $CrF_3$; $CuO$; $Cu_2O$; $CuS$; $Cu_2S$; $CuP_2$; $Cu_3P$; $CuF_2$; $Fe_2O_3$; $FeO$; $FeOF$; $FeS_2$; $FeS$; $Fe_2S_2F_3$; $Fe_3N$; $FeP$; $FeF_2$; $FeF_3$; $FeOF$; $Ga_2O_3$; $GeO_2$; $MnO_2$; $Mn_2O_3$; $Mn_2O_5$; $MnO$; $MnS$; $MnS_2$; $MnP_4$; $MnF_2$; $MnF_3$; $MnF_4$; $MoO_3$; $MoO_2$; $MoS_2$; $Nb_2O_5$; $NiO$; $NiS_2$; $NiS$; $Ni_3S_2$; $Ni_3N$; $NiP_3$; $NiP_2$; $Ni_3P$; $NiF_2$; $PbO$; $RuO_2$; $Sb_2O_3$; $SnF_2$; $SnO_2$; $SrO_2$; $TiS_2$; $TiF_3$; $V_2O_3$; $V_2O_5$; $VF_3$; $WS_2$; $ZnF_2$; and combinations thereof.

The material include a cation that undergoes an exothermic reaction with the material. Certain examples include Mg, Na, and Li. As an example for $FeF_3$ conversion material and Li cation, the conversion material when created, or when in the discharged state, may be an amorphous mixture of lithium, iron, and fluorine in the ratio of approximately $Li_3FeF_3$. In certain embodiments, the three elements are intimately intermixed on an atomic scale. In various implementations, the conversion material is characterized by an iron to fluorine to lithium ratio of from about 1:1.5:1.5 to 1:4.5:4.5.

Certain disclosed embodiments concern use of a redox reaction of lithium ions with a metal fluoride as a source of energy in positive electrode materials. As an example, a suitable positive electrode material is, in the charged state, ferric fluoride in very small particles, which may be the size of quantum dot (e.g., about 5 nm in the smallest cross-section) or in a glassy or amorphous state. In some embodiments, electrodes made of metal fluoride redox materials are employed in batteries having solid electrolytes such as inorganic electrolytes. A specific example of such electrolyte is LiPON.

In some implementations, the discharge of the positive electrode is accompanied by the reaction of ferric fluoride or other transition metal fluoride with lithium ions that have migrated into or inserted into the ferric fluoride matrix and there react to form lithium fluoride and elemental iron. The large Gibbs free energy associated with this reaction provides a very high available energy for a battery. This energy may be compared with that of a standard lithium insertion (or lithium intercalation depending on the electrode matrix) cathode materials such as lithium cobalt oxide, lithium manganese oxide, lithium titanate, and the like used in conventional lithium ion batteries. The materials disclosed herein combine during discharge with a large number of lithium atoms per transition metal. During charge, intercalation reactions involve at most one lithium atom per transition metal (e.g., as lithium is extracted as $Li^+$, cobalt oxidizes from $Co^{3+}$ to $Co^{4+}$), whereas in conversion reactions such as those producing $FeF_3$, 3 lithium atoms react per transition metal. In fact, most insertion compounds react approximately half a lithium atom per transition metal because the electrode structure becomes unstable if more than ½ of the lithium is extracted. This is why the transition metal electrode materials disclosed herein provide a significantly higher capacity (e.g., about 700 mAh/g or greater) than conventional electrode materials, e.g., 140 mAh/g for $LiCoO_2$. This capacity is available even at high rates and over many cycles when the electrode possesses suitably high ionic and electronic conductivity as disclosed herein.

A non-oxide cathode also presents safety advantages. A typical Li-ion battery uses a high voltage oxide cathode that is in thermodynamic disequilibrium with oxygen gas in the atmosphere. A relation exists between the voltage and the thermodynamic oxygen partial pressure; for instance, at 4.2V vs $Li/Li^+$, the equilibrium oxygen partial pressure of an oxide, for example $LiCoO_2$ at room temperature is $10^{87}$ atm (Godshall et al, J ElectrochemSoc, 131 (1984) 543). Kinetics may prevent the rapid evolution of oxygen, but this large driving force will inevitably involve the release of oxygen, this is why batteries must have vents for safety purposes. If a safety event occurs that raises the temperature of the battery or otherwise presents an occasion for oxygen evolution, the rapid release of oxygen into the gas phase and the attendant expansion of oxygen as it transitions from solid to gas may result in an explosion. In contrast, due to the higher stability of lithium halides relative to lithium oxide, and the lower voltage of lithium halide electrodes, the safety risks are substantially lower. At 4V vs $Li/Li^+$ and even 100° C., the equilibrium partial pressure of fluorine is $10^{-55}$ atm.

Some example materials that can be included in the nanodimensioned materials made by the methods set forth herein include the compounds listed in Table 1.

TABLE 1

Example Metal Compounds for Conversion Materials

| | X=O | X=S | X=N | X=P | X=F |
|---|---|---|---|---|---|
| Bi | | | | | $BiF_3$ |
| Ti | | | | | $TiF_3$ |
| V | | | | | $VF_3$ |
| Cr | $Cr_2O_3$ | CrS | CrN | | $CrF_3$ |
| Mn | $MnO_2$, $Mn_2O_5$, MnO | MnS | | $MnP_4$ | |
| Fe | $Fe_2O_3$, FeO | $FeS_2$, FeS | $Fe_3N$ | FeP | $FeF_3$, $FeF_2$ |
| Co | $Co_3O_4$, CoO | $CoS_2$, $Co_{0.92}S$, $Co_9S_8$ | CoN, $Co_3N$ | $CoP_3$ | $CoF_2$, $CoF_3$ |
| Ni | NiO | $NiS_2$, NiS, $Ni_3S_2$ | $Ni_3N$ | $NiP_3$, $NiP_2$, $Ni_3P$ | $NiF_2$ |
| Cu | CuO, $Cu_2O$ | CuS, $Cu_2S$ | | $CuP_2$, $Cu_3P$ | $CuF_2$ |
| Mo | $MoO_3$, $MoO_2$ | $MoS_2$ | | | |
| W | | $WS_2$ | | | |
| Ru | $RuO_2$ | | | | |

Examples of suitable charged state cathode materials, suitable for use with the nanodimensioned materials set forth herein, include sulfides, oxides, halides, phosphides, nitrides, chalcogenides, oxysulfides, oxyfluorides, sulfur-fluorides, and sulfur-oxyfluorides. In various embodiments, the charged materials include one or more of the following: AgF; $AlF_3$; $BiF_3$; $B_2O_3$; $Co_3O_4$; CoO; $CoS_2$; $Co_{0.92}S$; $Co_3S_4$; $Co_9S_8$; CoN; $Co_3N$; $CoP_3$; $CoF_2$; $CoF_3$; $Cr_2O_3$; $Cr_3O_4$; CrS; CrN; $CrF_3$; CuO; $Cu_2O$; CuS; $Cu_2S$; $CuP_2$; $Cu_3P$; $CuF_2$; $Fe_2O_3$; FeO; FeOF; $FeS_2$; FeS; $Fe_2S_2F_3$; $Fe_3N$; FeP; $FeF_2$; $FeF_3$; $Ga_2O_3$; $GeO_2$; $MnO_2$; $Mn_2O_3$; $Mn_2O_5$; MnO; MnS; $MnS_2$; $MnP_4$; $MnF_2$; $MnF_3$; $MnF_4$; $MoO_3$; $MoO_2$; $MoS_2$; $Nb_2O_5$; NiO; $NiS_2$; NiS; $Ni_3S_2$; $Ni_3N$; $NiP_3$; $NiP_2$; $Ni_3P$; $NiF_2$; PbO; $RuO_2$; $Sb_2O_3$; $SnF_2$; $SnO_2$; $SrO_2$; $TiS_2$; $TiF_3$; $V_2O_3$; $V_2O_5$; $VF_3$; $WS_2$; $ZnF_2$; and combinations thereof. As an example, a suitable cathode material is, in the charged state, ferric fluoride ($FeF_3$) in very small particles, which may be the size of a quantum dot (e.g., about 5 nm in the smallest cross-section) or in a glassy or amorphous state. In certain implementations, the metal compound component is $FeF_x$, where x is between 1 and 3.5. In certain embodiments, the metal compound component is $CuF_x$, where x is between 1 and 3. In certain implementations, the metal compound component is $CoF_x$, where x is between 1 and 3.5. In certain implementations, the metal compound component is $NiF_x$, where x is between 1 and 3.

Additional examples of materials suitable for use with the methods and systems set forth herein include ionic conductor components which include, without limitation, lithium titanates, lithium iron phosphates, vanadium oxides, cobalt oxides, manganese oxides, lithium sulphides, molybdenum sulphides, iron sulphides, LiPON, $MoO_3$, $V_2O_5$, carbon, copper oxides, lithium insertion compounds such as $LiCoO_2$, $Li(CoMn)O_2$, $LiMn_2O_4$, $Li(CoNiMn)O_2$, $Li(NiCoAl)O_2$, or other materials having relatively high lithium ion conductivity. In certain implementations, ionic conductor is made of the same material as that of a solid state electrolyte. In certain embodiments, ionic conductor is made of a different material than that of the solid state electrolyte. The ionic conductor may itself possess electrochemical activity (e.g., $MoO_3$ or $V_2O_5$) or may not show electrochemical activity (e.g., LiPON). In certain implementations, the ion is LiPON.

In some examples, mixed electronic ionic conductors are suitable for use with the materials manufactured by the methods set forth herein.

If the cathode includes an ion conductor, as set forth above, component, the minimum amount of the ion conductor component will generally be the amount that allows sufficient lithium ion and electron transport for functioning of the device. The maximum amount will be that amount of the ion conductor component that provides an electrochemically active cathode material with the required specific capacity or other electrical characteristics when operating at required rates, voltage windows, and states of charge. In certain embodiments of the devices including an ion conductor component, the minimum amount of the ion conductor component is about 1% or about 5% of the cathode material by weight. In one version of the devices including an ion conductor component, the maximum amount of the ion conductor component is about 50% or 25% of the cathode material by weight.

In some examples, the nanodimensioned materials set forth herein include dopants incorporated into the manufactured material and which may be selected from aluminum, silicon, the transition metals, and the rare earth elements. Examples of metals that may be used as dopants include zirconium (Zr), aluminum (Al), niobium (Nb), hafnium (Hf), and chromium (Cr), silicon (Si), titanium (Ti), vanadium (V), and yttrium (Y). Examples of metal fluorides suitable as dopant sources include $ZrF_x$, $AlF_x$, $NbF_x$, $SiF_x$, $HfF_x$, $CrF_x$, $TiF_x$, $VF_x$, and $YF_x$. Examples of metal oxides or metal hydroxides that may be suitable as dopants include $TiO_2$, $SiO_2$, Li, O, $Li_2O$, and LiOH. A subclass of metal oxides that may be used as dopants include transition metal oxides. In some cases, oxygen itself acts as dopant.

In some examples, dopants may be suitable as lithium-ion conductivity enhancers such as zirconium (Zr), aluminum (Al), niobium (Nb), hafnium (Hf), chromium (Cr), silicon (Si), and lithium (Li). Some dopants may be suitable to promote electronic conductivity in transport materials such as ferric fluoride. Examples of such dopants include zirconium (Zr), aluminum (Al), niobium (Nb), hafnium (Hf), chromium (Cr), carbon (C), copper (Cu), titanium (Ti), vanadium (V), cobalt (Co), nickel (Ni), manganese (Mn), and zinc (Zn). Metal fluorides and metal oxides may also be used as dopant sources to promote electronic conductivity. Examples of such fluorides and oxides include $ZrF_x$, $AlF_x$, $NbF_x$, $HfF_x$, $CrF_x$, $SiF_x$, $TiF_x$, $VF_x$, $YF_x$.$TiO_2$, $SiO_2$, Li, O, and $Li_2O$.

Example dopant atomic ratios range from 0% to about 20%, or about 5% to about 10%.

III. Example Methods Suitable for Use with the Systems and Methods Set Forth Herein In an example set forth herein, a combination of precursors includes $FeF_2$ (melting temp 970 deg C.), LiF and Li (melting temp of Li 180 Deg C). In some examples, using these precursors the flash evaporator temperature would operate in the range of 1000 to 1500 deg C.

In an alternative example, a combination is $FeF_3$ (melting temp 1000 Deg C), LiF and Li. Results suggest that there is a relatively broad window where $FeF_3$ flash evaporation results in $FeF_2$ species incorporation in the product. The same scavenging of fluorine by the lithium is expected in this case so a multiple gun approach could possibly be advantageous. In certain examples, using these precursors the flash evaporator temperature would operate in the range of 1100 to 1600 deg C.

In an alternative example, a combination of $NiF_2$ (melting point ~1475° C.) and Li (melting point 180° C.) are evaporated. In an alternative example, a combination of $CuF_2$ (melting point approximately 836° C.) and Li are evaporated.

In an example, another precursor combination would be used with the aforementioned combinations but without Li. In some of these examples, lithium is added in a subsequent step after the formation of a material using the initial precursors. In an example, the techniques add a layer of Li at the anode or over lithiate the electrolyte so that it gives up Li to the cathode.

In an example, the precursor powder is transferred in an inert gas stream to carry the precursor thru the gun and help move the vapor to the cooling chamber or through the process region. In this case the flash evaporator would operate in a pressure regime starting at about 500 mtorr to 100 torr. In another embodiment the chamber is maintained under high vacuum. In some of these examples, the precursor powder fall by gravity or continuously feed the precursor in a wire form or as small pellets.

IV. Example Apparatus and Systems Suitable for Use with the Systems and Methods Set Forth Herein FIG. 1 illustrates certain deposition techniques, including vertical deposition on a cylinder (left side of FIG. 1) or on a flat substrate (right side of FIG. 1), according to an embodiment of the present invention. As shown, three sources (1, 2, and 3) are configured around a periphery of a cylindrical member, which is rotated. In an example, the present apparatus and method provides for uniform mixing of three (3) components (Li, FeF$_2$, LiF). Thereafter, the apparatus and method provides for a fast cooling rate via a cooled surface, which is rotated about a center axis.

Also shown are three sources (1, 2, and 3) are configured overlying a disk shaped substrate, which is rotated. In an example, the present apparatus and method provides for uniform mixing of three (3) components (Li, FeF$_2$, LiF). Thereafter, the apparatus and method provides for a fast cooling rate via a cooled surface, which is rotated about a center axis.

Figure 2:
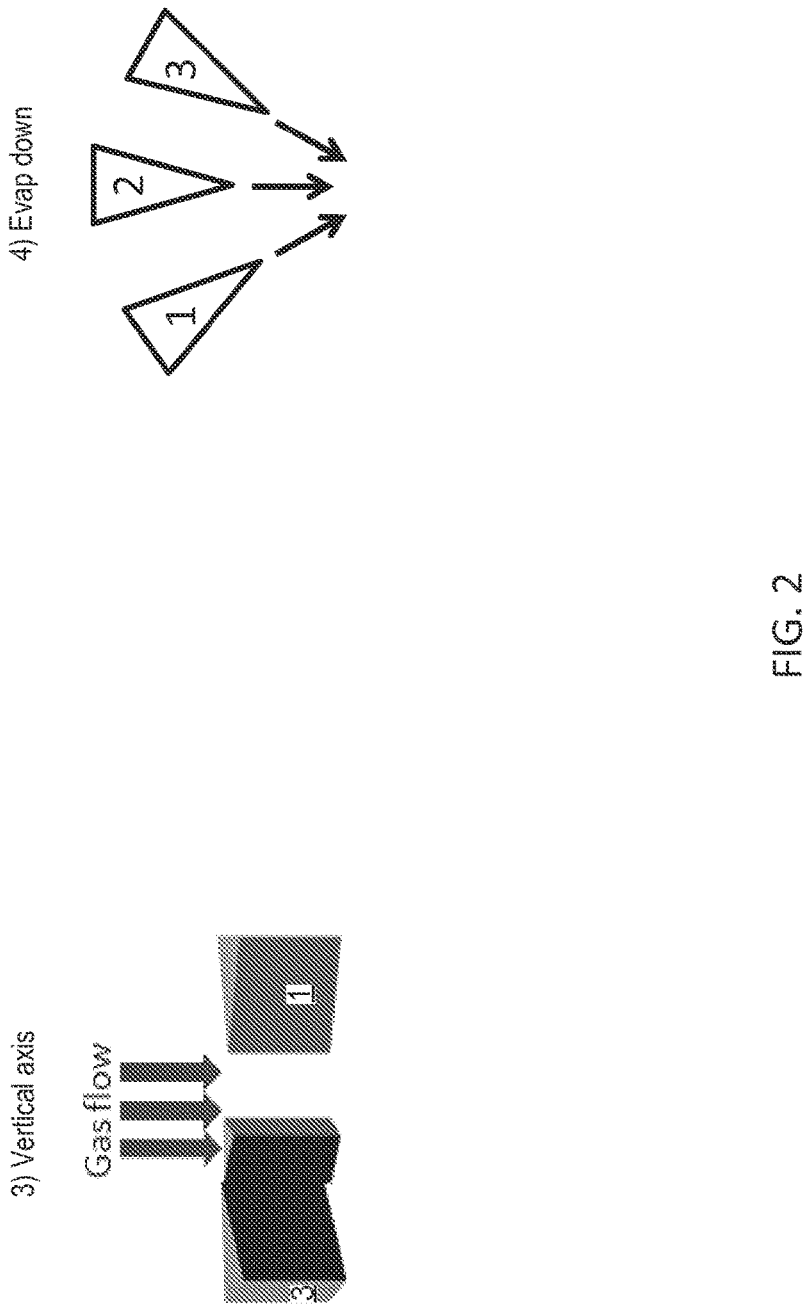
FIG. 2 illustrates deposition techniques, including vertical and horizontal deposition, and spatial intermixing, according to an embodiment of the present invention.

FIG. 2 illustrates deposition techniques, including vertical and horizontal deposition, and spatial intermixing, according to an embodiment of the present invention. Also shown are three sources (1, 2, and 3) are configured in a concatenated manner and having a carrier gas flowed normal to a direction of each of the three sources. In an example, the present apparatus and method provides for uniform mixing of three (3) components (Li, FeF$_2$, LiF). Thereafter, the apparatus and method provides for a fast cooling rate via a cooled surface. An apparatus and method for configuring three sources directed to a common process region is also shown.

Figure 3:
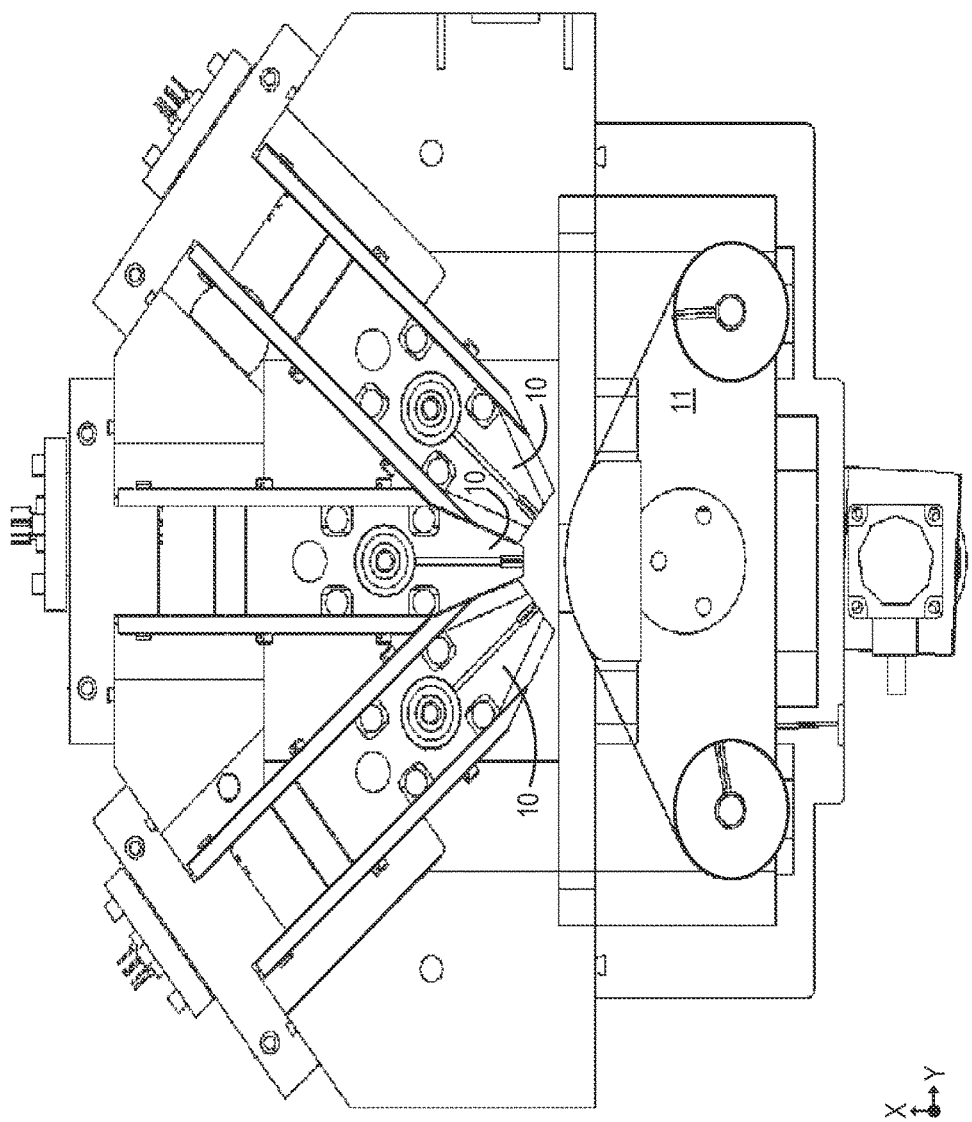
FIG. 3 is an overall top view diagram of a deposition apparatus according to an embodiment of the present invention.
Figure 4:
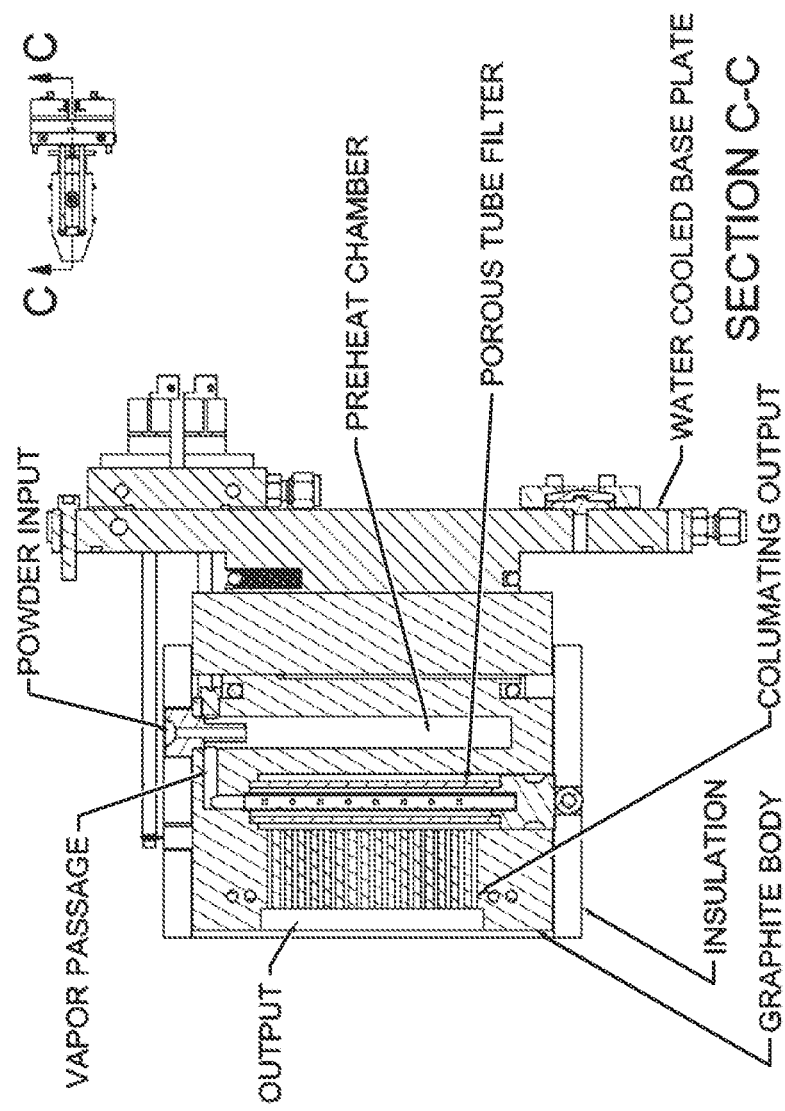
FIG. 4 shows a side view of an example of a deposition apparatus according to an embodiment of the present invention.

FIG. 3 is a top view diagram of a deposition apparatus according to an embodiment of the present invention. In an example, the invention provides a deposition apparatus for forming a film of material for a solid state battery. The apparatus has a first source configured for a first precursor species, a second source configured for a second precursor species, and a third source configured for a third precursor species. The apparatus has a first nozzle coupled to the first source and configured for outputting the first precursor species in a first molecular form and a second nozzle coupled to the second source and configured for outputting the second precursor species in a second molecular form. The apparatus has a third nozzle coupled to the third source and configured for outputting the third precursor species in a third molecular form. Apparatus includes a process region coupled to the first nozzle, the second nozzle, and the third nozzle and configured to cause formation of first plurality of particles, ranging from about first diameter to about a second diameter, by intermixing the first precursor species with the second precursor species and the third precursor species. The apparatus has a thermal sink provided in the process region, and configured for cooling the first plurality of particles at a rate of greater than 100° C./s to a specified temperature. In some examples, the thermal sink includes a substrate that is cooled to a temperature less than the vapor temperature of the precursor species so that the vaporized precursor species condense onto the substrate.

In an example, the intermixing is provided in a process region, e.g., chamber. In an example, the process region is a vacuum environment or a predetermined environment. In an example, the process region comprises a carrier gas, e.g., nitrogen, argon, or other inert species. Further details of the present apparatus and method can be found throughout the present specification and more particularly below.

In an example, the present apparatus and method can be configured with various materials for elements in a solid state battery. In an example, the disclosed embodiments concern positive electrodes containing a high capacity material that reversibly undergoes a redox reaction at a high rate over many cycles of charge and discharge. Such materials are sometimes referred to herein as "conversion" materials.

FIG. 3 shows three nozzles (10) for introducing precursor chemical vapors onto a roll to roll mechanism (11).

Figure 6:
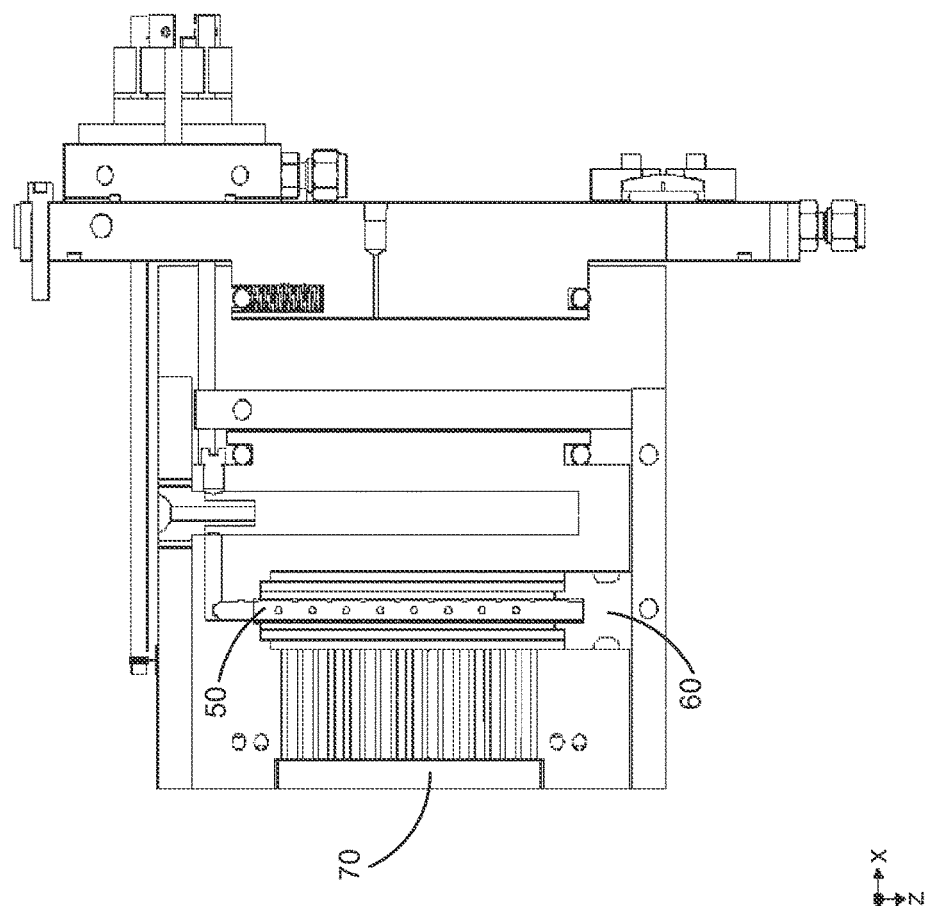
FIG. 6 shows a side view of an example of a deposition apparatus according to an embodiment of the present invention.
Figure 7:
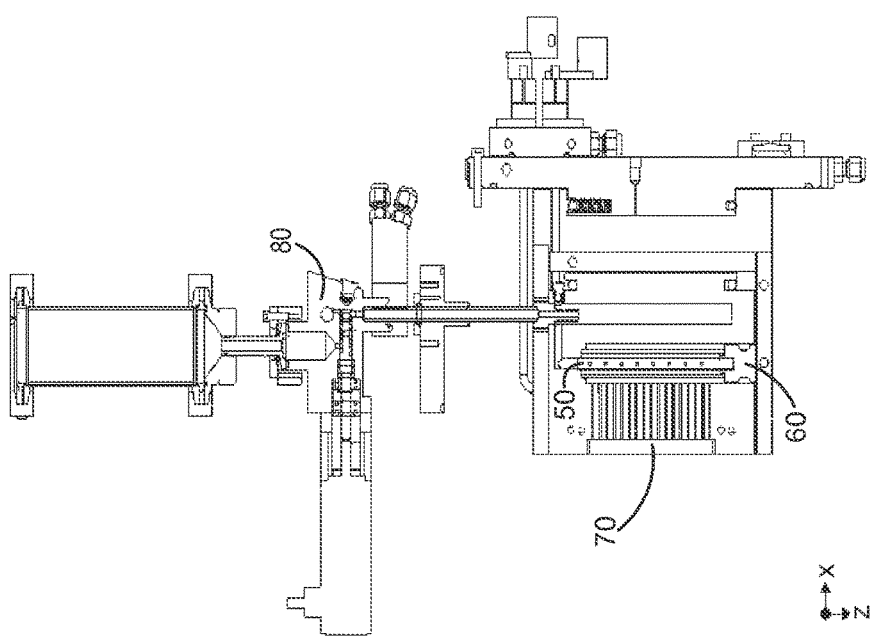
FIG. 7 shows a side view of an example of a deposition apparatus according to an embodiment of the present invention.
Figure 8:
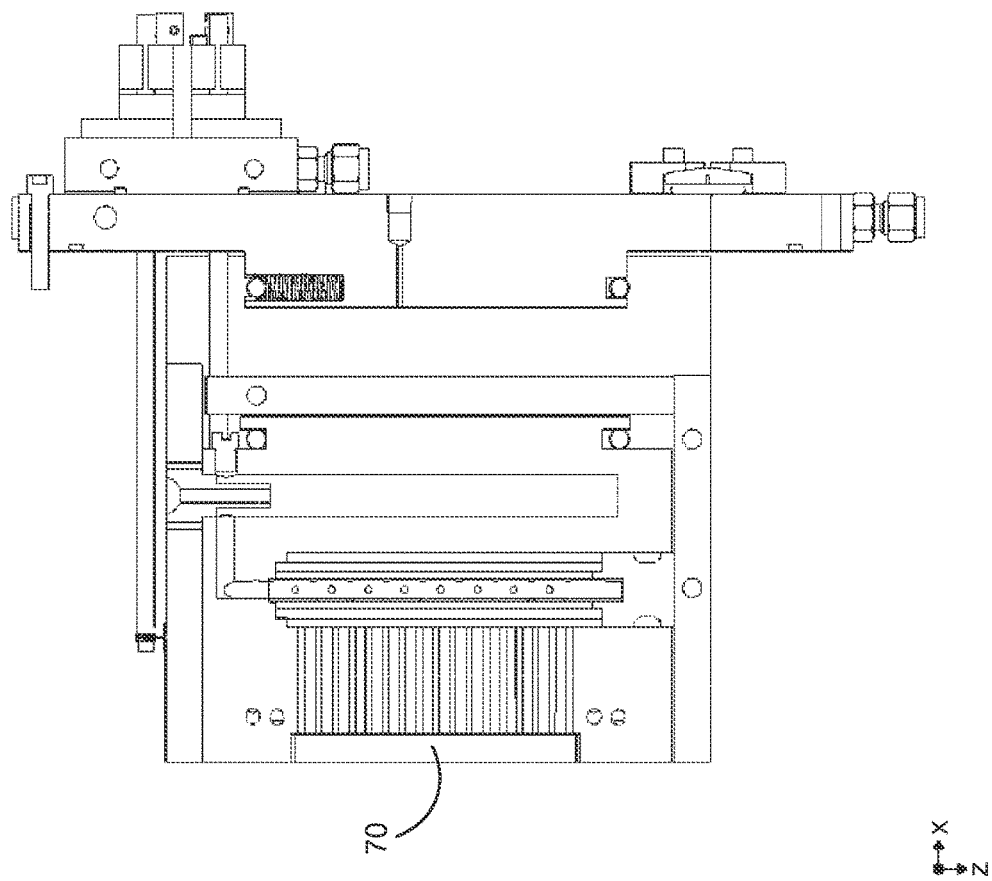
FIG. 8 shows a side view of an example of a deposition apparatus according to an embodiment of the present invention.
Figure 9:
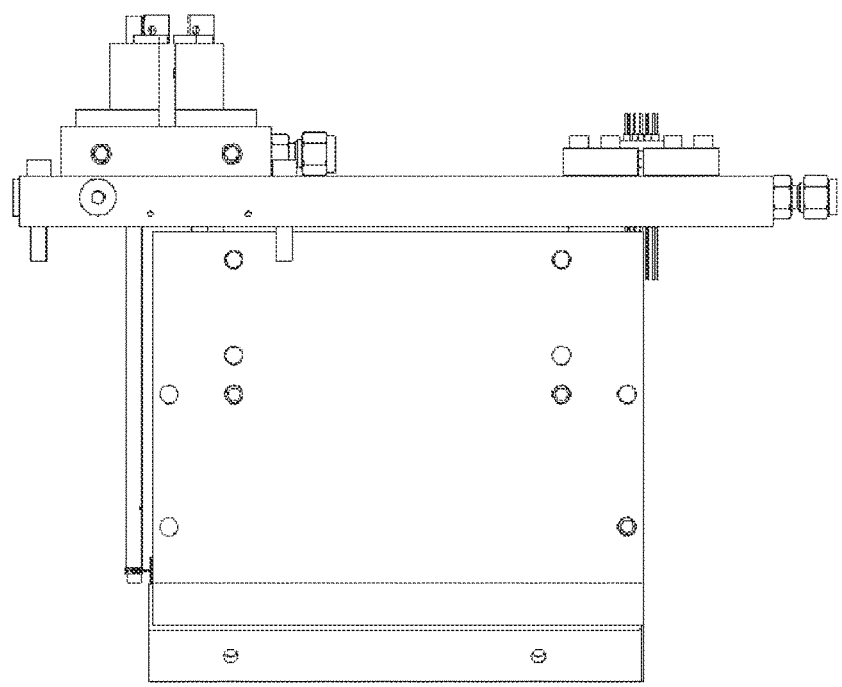
FIG. 9 shows are reduced diagram of an example of a deposition apparatus according to an embodiment of the present invention.

FIGS. 6, 7, and 8 shows a porous device (50) for transferring vapors into a process region (60) and a transfer tube set up for transmitting the vapors to a deposition substrate (70). FIG. 7 also shows a delivery screw for delivering chemical precursors into the porous device (50) in which the chemical precursors can be flash evaporated into vapors.

Figure 11:
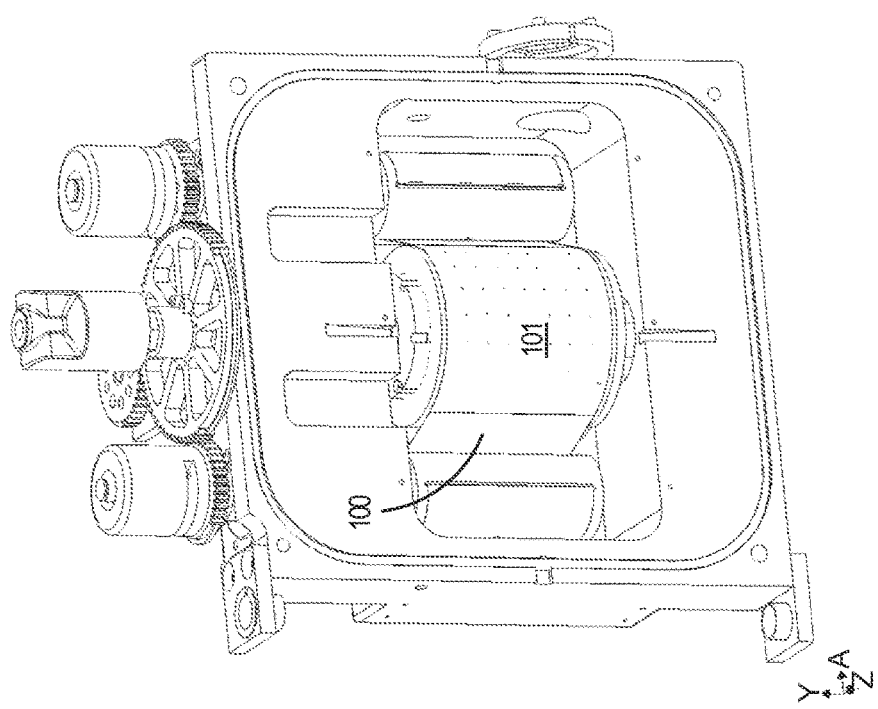
FIG. 11 shows an example foil drive or rotating drum.

FIG. 11 shows an example flash evaporator having a harvester (100) and a deposition substrate (101).

Figure 12:
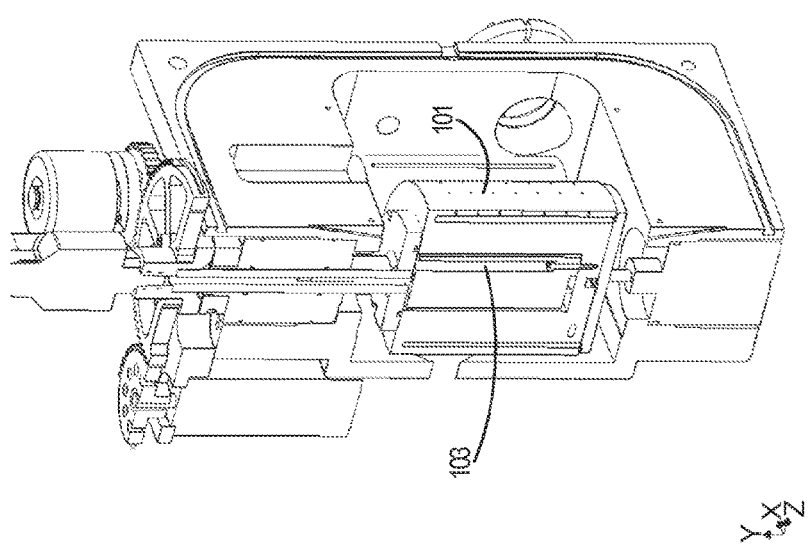
FIG. 12 shows an example foil drive in cross section showing the cooling channel and the backside gas circuit.
Figure 13:
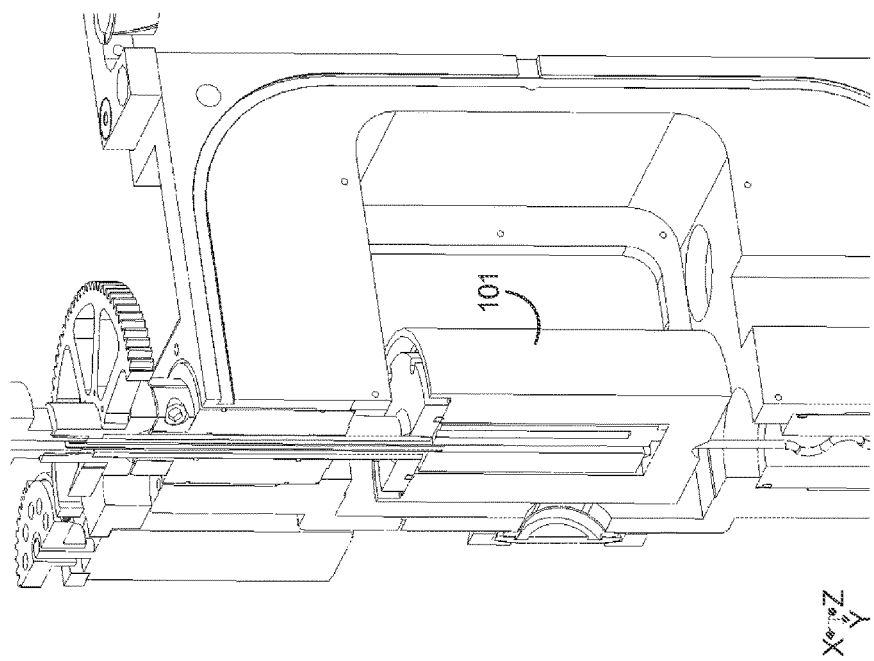
FIG. 13 shows an example of an apparatus according to an embodiment of the present invention and illustrating a drum with a scraper.

FIG. 12 shows a thermocouple (103) inside the deposition substrate which is used to monitor and control the temperature of the deposition substrate so that the deposited vapors cool thereupon under controlled conditions.

Figure 14:
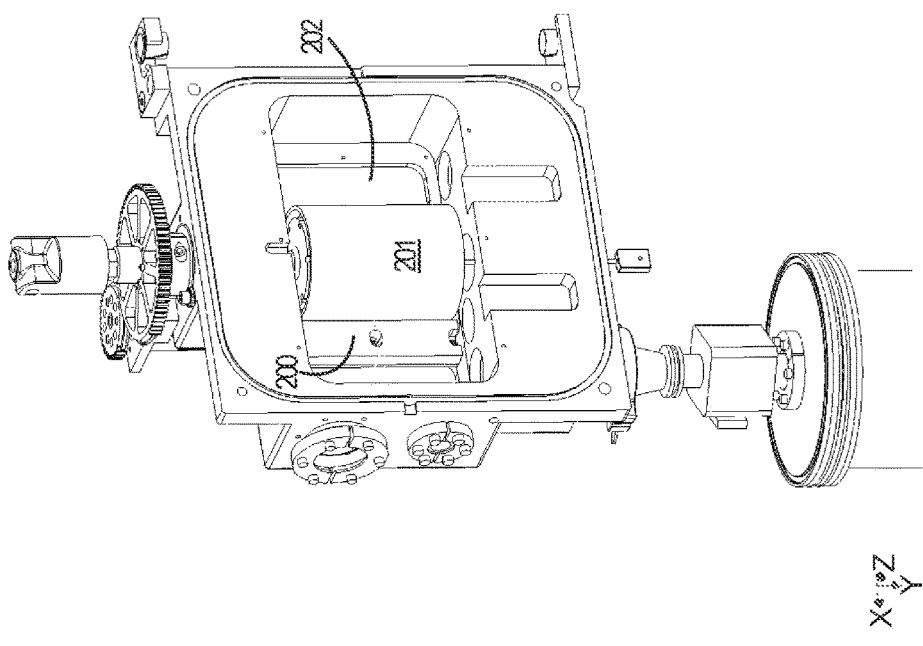
FIG. 14 shows an example of a deposition apparatus according to an embodiment of the present invention and illustrating the output channel and the thermocouple contact at the bottom.

FIG. 14 shows an example flash evaporator having a harvester (200) and a drum (201) and a process region (202).

Figure 15:
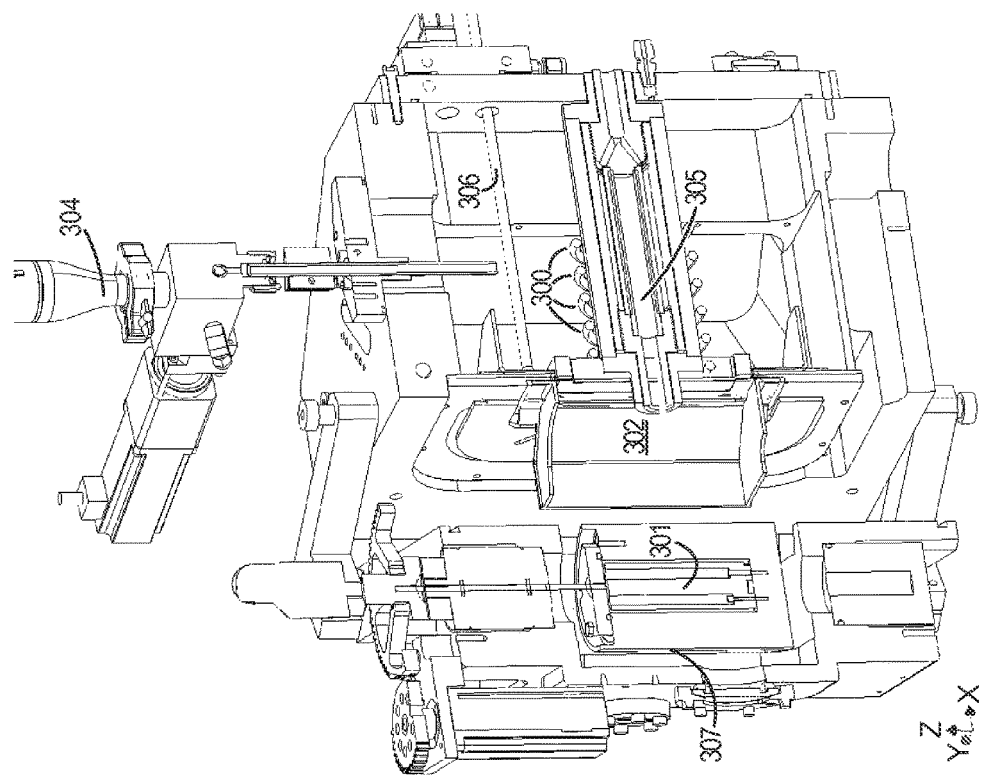
FIG. 15 shows an example of an inductively heated reaction region.
Figure 16:
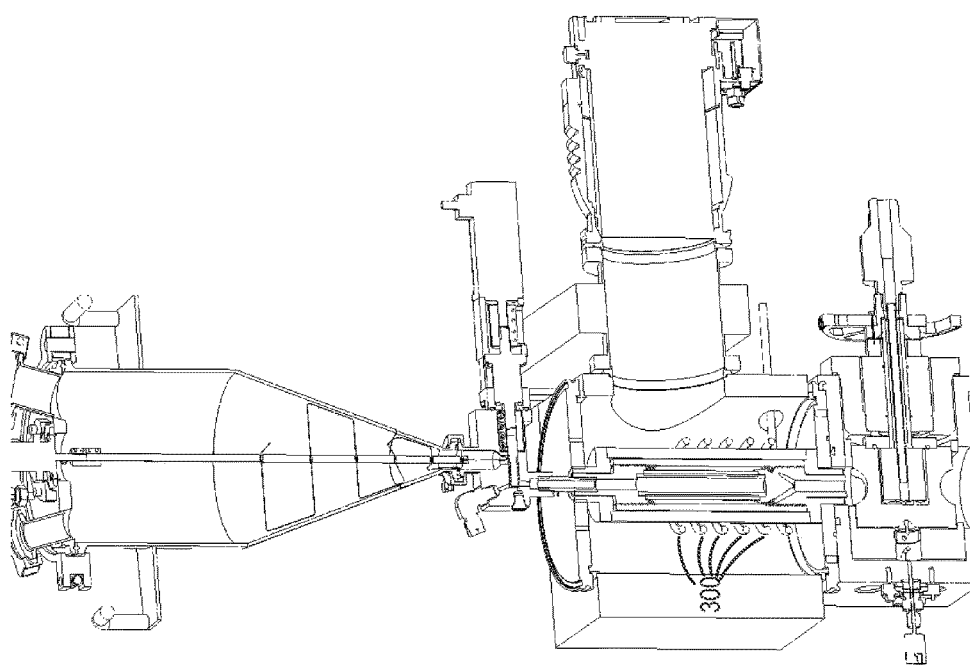
FIG. 16 shows a side view of an example of a deposition apparatus according to an embodiment of the present invention.

FIG. 15 shows inductively heating mechanism (300) in proximity to the process region (302). FIG. 15 also shows an active cooling mechanism (301) inside a rotating drum, onto which intermixed precursor vapors are deposited in accordance with the methods set forth herein. FIG. 15 shows a source of precursor material (304) which can be introduced via a transfer screw (306) into a transfer nozzle (305) and on to a process region (302). In FIG. 15, inductively heating coils (300) heat the transferred material to flash vaporize the material before it is deposited on the deposition surface (307). The deposition surface (307) is show in FIG. 15 in an open half-shell configuration so as to illustrate the active cooling mechanism (301).

Figure 17:
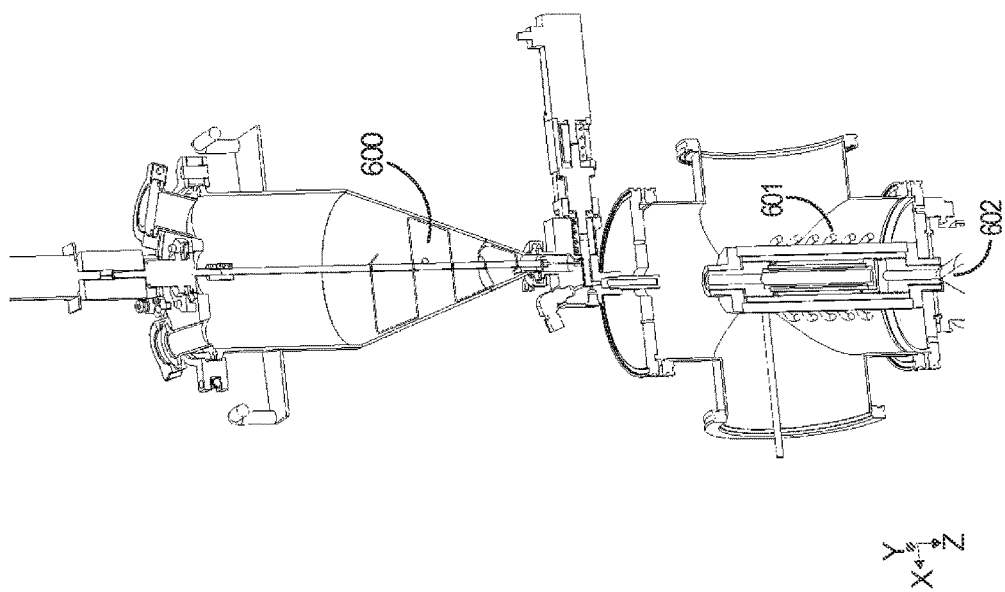
FIG. 17 shows a side view of an example of a deposition apparatus according to an embodiment of the present invention.

FIG. 17 shows a source of precursor chemicals, or a mixture of precursor chemicals (600) which are transferred to a heating region surrounded by inductive heating coils (601), which flash evaporate the precursor chemicals into vapors and which vapors and then transferred to the nozzle (602) to be thereafter sent to a deposition substrate.

In some examples, an embodiment of a Flash Evaporator set forth herein is coupled, or attached, to a glove box that includes an inert Argon or Nitrogen atmosphere in the glove box.

V. Cathode Active Materials Suitable for Use with the Systems and Methods Set Forth Herein Depending on the implementation, in the discharged state, the conversion material suitable for use with the methods and apparatus set forth herein may include an elemental metal material, one or more oxidizing species, and a reducing cation material. As an example, the discharge state may include at least an elemental metal such as iron, nickel, copper, cobalt, and/or manganese and a reducing cation halide such as lithium fluoride. The constituents of the discharged conversion material may be intimately distributed with one other in the discharged material. As described more fully below, these materials may be intermixed or distributed at a scale of about 20 nm or smaller.

In some examples, the materials manufactured by the present invention include nanodomains of materials, e.g., LiF Co, Cu, Ni, Mn and/or Fe, that have a mean spatial dimension of about 1, 2, 3, 4, 5, 6, 7, 8, 9, 10, 11, 12, 13, 14, 15, 16, 17, 18, 19, 20, 21, 22, 23, 24, or 25 nm.

In some examples, the materials manufactured by the present invention include nanodomains of materials, e.g., LiF Co, Cu, Ni, Mn and/or Fe, that have a median spatial dimension of about 1, 2, 3, 4, 5, 6, 7, 8, 9, 10, 11, 12, 13, 14, 15, 16, 17, 18, 19, 20, 21, 22, 23, 24, or 25 nm.

It should be understood that a positive electrode of the type described herein may exist in various states of charge. In some cases, a battery is designed or operated so that full discharge is never attained. Thus, if the fully charged conversion material is ferric fluoride for example, the "fully" discharged positive electrode may contain a mixture of elemental iron, lithium fluoride, and some ferric fluoride, and possibly some ferrous fluoride. The use of "discharged"

or "discharged state" herein is a relative term, referring only to a state of a conversion material that is more discharged than a charged state of the material. By the same token, the use of "charged" or "charged state" herein refers to a state of the conversion material that is more charged than a corresponding discharge state for the material.

Charged state—In a charged state, the metal species tends to pair with the oxidizing species often forming a compound. During charging, the oxidizing species tends to unpair from the reducing cation species and pair with the metal species. The reducing cation species tend to move out of the positive electrode and migrate and/or diffuse to the negative electrode where they exist in a more strongly reduced state (e.g., as an element metal such as lithium metal or lithium inserted in a matrix such as carbon or silicon).

As an example, during charge, elemental iron may pair with fluoride anions to form ferric fluoride and/or ferrous fluoride. Concurrently, fluoride anions may unpair from a reducing cation such as lithium. The now freed lithium cation migrates and/or diffuses to the positive electrode where it is reduced to elemental lithium or a lithium intercalation material.

The scale of the constituents in the conversion material, whether in the charged or discharged state, influences relevant electrochemical properties of the materials. It has been found that conversion materials having their constituents or components separated by very small distances, sometimes on the order of atomic scale, may possess certain performance benefits as compared to conversion materials that have constituents separated by greater distances. In some embodiments, the constituents are separated by distance no greater than about 20 nm. Such conversion materials have been observed to provide various benefits such as increased cycle lifetime, improved efficiency, improved energy density, improved power density, and improved low temperature performance. The term "nanostructured" is sometimes used to refer to conversion materials in charged or discharged states in which the constituent materials are separated from one another at a scale of about 20 nm or less In some embodiments, in the discharged state, the conversion material contains discrete grains or crystallites of an elemental metal (or an alloy thereof) and a lithium compound. In some embodiments, the discrete grains of metal or alloy are embedded in a continuous matrix of the lithium compound. In other embodiments, the metal or alloy and lithium compound are present in small particles or other discrete structures. In either case, the various components of the conversion materials may be mixed and/or otherwise exist at a nanostructured scale. When particles are present, they may have an average or median characteristic dimension of about 20 nm or less or about 10 nm or less or about 5 nm or less. Such particles may be homogenous (e.g., containing exclusively metal species) or inhomogeneous (e.g., composed of a combination of metal species, oxidizing species, and reducing cation species).

In various embodiments, the conversion material is formed or mixed such that its constituents are separated on a scale of about 1 nm or less. Some such materials may be characterized as glassy or amorphous. A glassy material may be viewed as one that is substantially non-crystalline, substantially uniform in composition, and substantially lacking in long-range order. In some examples, a glassy conversion material is substantially homogeneous within a volume of 1000 nm³.

The conversion material is structured at a nano level (i.e., domains of the material have average physical dimensions defining the domain boundary of less than 20 nm in length).

In one example, FeF$_3$ molecules in a charged conversion material may be characterized by a glassy or amorphous structure and substantially homogeneous, where the conversion material is substantially free of clumps (e.g., multiple molecules bundled together). In some examples, in the discharged state, the conversion material may include glassy compounds of lithium, sodium and/or magnesium. Such glassy or amorphous structures may be provided as particles, layers, etc. Within these particles or layers, the constituent metal, oxidizing, and reducing cation species are separated from one another on the length scales noted.

Depending on the implementation, in the discharged state, the conversion material may include a metal material, one or more oxidizing species, and a reducing cation material separated at a scale of less than about 20 nm. More specifically, the conversion materials are substantially homogeneous within a volume of about 1000 nm³ or less. In an example, molecules including metal, oxidizing species, and a reducing cation are structured at a nanometer scale, essentially without forming clumps of two or more molecules. As presented in an example above, the discharged material may include an elemental form of the metal species and a compound of the reducing metal cation and an anion of the oxidizing species.

In the charged state, the conversion material contains a compound of the metal. In some embodiments, the electrochemical charge-discharge reaction at the positive electrode may be represented, without stoichiometry considerations, by the following equation:

$$M + LiX \leftrightarrow MX + Li^+ + e^-$$

where M is the metal species and X is the oxidizing species; e.g., an anion or electron rich species of an element such as a halide, oxygen, sulfur, phosphorus, nitrogen, selenium, or combination of such elements. In a specific example, the oxidizing species is combination of a halogen ion and a chalcogenide ion (e.g., fluoride and sulfide). In certain variations of the above-referenced chemical equation, lithium is replaced with sodium, potassium, magnesium, or other electropositive metal ion.

The metal compound MX present in the charged positive electrode material should react with lithium ions according to discharge path of the above equation. Typically, the discharge reaction is associated with an appropriately large Gibbs free energy when considering the full cell reaction Li+MX→LiX+M. The Gibbs energy will correspond to the cell voltage of the reaction by $\Delta G_{rxn} = -E*n*F$ where E is the voltage, n is the number of electrons that react and F is the Faraday constant. In certain embodiments the Gibbs energy of the reaction is about 500 kJ/mol or about 750 kJ/mol or about 1 MJ/mol.

In certain implementations, the voltage of a fully charged positive electrode is at least about 2.0 V versus a lithium metal electrode or at least about 3.0 V versus a lithium metal electrode or at least about 4.0 V versus a lithium metal electrode or at least about 4.5 V versus lithium metal electrode.

In the charged state, the positive electrode conversion material may maintain the general morphological characteristics present in the discharged state. These characteristics include constituent separation distance (e.g., particle or crystallite size), matrix structure (e.g., glassy), etc. In some cases, the material will expand in the discharged state. Depending on the material, the volume change may be about 5% or greater or about 10% or greater.

Examples of suitable metal species M include transition metals, aluminum and bismuth. In some cases, the metal is selected from first row transition metals. Specific examples transition metals that may be used include vanadium, chromium, copper, iron, cobalt, manganese, nickel, ruthenium, titanium, silver, and tungsten. Alloys of such metals may also be used. Examples of such alloys include iron alloyed with cobalt and iron alloyed with manganese. Examples of suitable oxidizing species anions X include O, S, N, P, F, Se, Cl, I, and combinations thereof.

VI. Batteries and Devices Suitable for Use with the Systems and Methods Set Forth Herein In certain embodiments, these particles made by the methods described herein have a median characteristic dimension of about 20 nm or less or about 10 nm or less. In some aspects, the particles have a median characteristic dimension of about 5 nm or less. In some cases, the conversion material may be a glassy or amorphous material. In some implementations, the particles of the positive electrode have a very tight distribution, e.g., a standard deviation of about 50% or less. In some implementations, at least about 90% of the particles in the electrode have a characteristic dimension of between about 1 and 5 nm. In some embodiments, the particles' characteristic dimension has a $d_{50}$ value of about 20 nm or less or about 10 nm or less or about 5 nm or less. The $d_{50}$ is defined as the characteristic dimension at which 50% of the particles are smaller. The particles may be present in these sizes at any point in the life of the positive electrode. In some examples, the particles are present in these sizes in the positive electrode as fabricated. In some examples, the particles are present in these sizes after the first discharge of the positive electrode, or after the first full charge/discharge cycle of the positive electrode. In certain embodiments, the average size of the particles of the positive electrode do not vary in characteristic dimension by more than about 500% or by about 100% over multiple cycles (e.g., 10 cycles, 50 cycles, 100 cycles, or 500 cycles).

In certain embodiments, a solid electrolyte is used with the materials made by the methods set forth herein. The solid electrolyte provides an ionically conductive medium without consuming significant amounts of active material in the formation of SEI layers. Therefore the positive electrode material can maintain its intrinsically high reversible capacity. It should be understood, however, that in other embodiments, the positive electrodes described herein are used with liquid and gel phase electrolytes.

A typical Li-ion battery uses a flammable hydrocarbon electrolyte (e.g., a cyclic organic carbonate or mixture of these). If a safety event that generates heat (such as a short circuit) occurs, this electrolyte may burn, releasing its energy in a fire. If the increased temperature results in oxygen evolution from the oxide cathode, an explosion may result from the rapid expansion into the gas phase. In contrast, a solid electrolyte it much more stable—it does not provide a fuel in the event of a short circuit.

Many types of solid electrolyte layer can be used. In some cases, the electrolyte material has a relatively high lithium ion conductivity, e.g., at least about $10^{-6}$ Siemens/centimeter or at least about $10^{-4}$ Siemens/centimeter. Examples of inorganic materials that could be used as the solid electrolyte layer include LiPON and similar lithium ion conductors. Further details of other materials can be found throughout the present specification and more particularly below.

In an example, the present invention provides an energy storage device comprising a cathode region or other element. The device has a major active region comprising a plurality of first active regions spatially disposed within the cathode region. The major active region expands or contracts from a first volume to a second volume during a period of a charge and discharge. The cathode electrode further comprises an electron conductive additive such as a carbon compound and a binding element to enhance adhesion and cohesion. The device has a catholyte material spatially confined within a spatial region of the cathode region and spatially disposed within spatial regions not occupied by the first active regions. The device has a protective material formed overlying exposed regions of the cathode material to substantially maintain the sulfur species within the catholyte material.

In an alternative example, the present invention provides an energy storage device comprising a cathode region or other element. The device has a major active region comprising a plurality of first active regions spatially disposed within the cathode region. The cathode electrode further comprises an electron conductive additive such as a carbon compound and a binding element to enhance adhesion and cohesion. The device has a catholyte material spatially confined within a spatial region of the cathode region and spatially disposed within spatial regions not occupied by the first active regions.

In an alternative example, the present invention provides an energy storage device comprising a cathode region or other element. The device includes a major active region comprising a plurality of first active regions spatially disposed within the cathode region, and a catholyte material spatially confined within a spatial region of the cathode region and spatially disposed within spatial regions not occupied by the first active regions. In an example, each of the plurality of active regions has a size ranging from about 20 nm to about 3 um.

In an example, the device has a polymer material configured within a vicinity of the catholyte material, the polymer material serving as a binder material. In an example, the polymer material is formed overlying the catholyte material. In an example, the polymer material serves as an electrolyte. In an example, the polymer material is configured to accommodate an internal stress within the cathode region during the change in volume from the expansion to a contraction.

In an example, the present invention provides an energy storage device comprising a cathode region or other region(s). The device has a major active region comprising a plurality of first active regions spatially disposed within the cathode region. The major active region expands or contracts from a first volume to a second volume during a period of a charge and discharge. The device has a catholyte material spatially confined within a spatial region of the cathode region and spatially disposed within spatial regions not occupied by the first active regions.

In an example, the present invention provides a method for manufacturing an energy storage device. The method includes forming a cathode region, the cathode region comprising a major active region comprising a plurality of first active regions spatially disposed within the cathode region.

In an example, the plurality of particles in the catholyte material is substantially homogeneous in a micro-scale while configured in the polycrystalline structure in a ten to one hundred micron scale. In an example, the cathode region comprises an active material, the active material comprising iron and fluorine.

In an example, the major active region is greater than 50 percent by volume of the cathode region. In an example, each of the plurality of active regions has a size ranging from about 20 nm to about 3 um.

In an example, a polymer material configured within a vicinity of the catholyte material. In an example, the polymer material serves as a binder material. The polymer material is formed overlying the catholyte material, the polymer material serving as an electrolyte. In an example, the polymer material is configured to accommodate an internal stress within the cathode region during the change in volume from the expansion to a contraction.

Although numerous examples of the invention have been illustrated and described, the invention is not so limited. Numerous modifications, variations, substitutions and equivalents will occur to those skilled in the art without departing from the spirit and scope of the present invention.

VII. Details of Certain Embodiment Systems and Example Methods

In an example, the present invention provides a flash evaporation method for forming a material, in which the method comprises 1) providing a first precursor species; 2) providing a second precursor species; 3) transferring the first precursor species through a first nozzle and outputting the first precursor species in a first molecular form; 4) transferring the second precursor species through a second nozzle and outputting the second precursor species in a second molecular form; 5) causing formation of first plurality of particles, ranging from about first diameter to about a second diameter, by intermixing the first precursor species in the first molecular form with the second precursor species in the second molecular form; and 6) cooling the first plurality of particles at a rate of greater than 100° C./s to a specified temperature.

In some of the examples set forth herein, the method includes intermixing the precursor chemicals and using one nozzle for flash evaporating both precursor chemicals. In other embodiments, at least one or more nozzles are used for the flash evaporation.

In some examples set forth herein, the process region is a vacuum environment or a predetermined environment; wherein the intermixing is provided within a spatial region and the subsequent cooling causes the first plurality of particles to be in a substantially amorphous state.

In some examples, the process region comprises a carrier gas; wherein the first precursor species and the second precursor species are among N precursor species, where N is greater than 2. Some example methods include further subjecting the first precursor species to a thermal process to preheat the precursor species. In certain examples, the methods include further comprising subjecting the second precursor species to a thermal process to preheat the precursor species.

In some examples set forth herein, the first precursor species is filtered prior to, or concurrent with, the delivery of the precursor species through a nozzle of the flash evaporation apparatus. In other examples, the second precursor species is filtered prior to, or concurrent with, the delivery of the precursor species through a nozzle of the flash evaporation apparatus. In yet other examples, the third or fourth precursor species is filtered prior to, or concurrent with, the delivery of the precursor species through a nozzle of the flash evaporation apparatus.

In some examples set forth herein, the first nozzle and the second nozzle of the flash evaporation apparatus are formed in a concatenated configuration.

In some examples set forth herein, the apparatus is configured to form a film of a particular thickness on a cooling substrate wherein the film is made from the precursor chemicals which are flash evaporated through the apparatus nozzles. In certain examples the thickness of the film is 5 nm, 10 nm, 15 nm, 20 nm, 25 nm, 30 nm, 35 nm, 40 nm, 50 nm, 55 nm, 60 nm, 65 nm, 70 nm, 75 nm, 80 nm, 85 nm, 90 nm, 95 nm, or 100 nm. In certain other examples, the thickness of the film is 1, 2, 3, 4, 5 µm, 10 µm, 15 µm, 20 µm, 25 µm, 30 µm, 35 µm, 40 µm, 50 µm, 55 µm, 60 µm, 65 µm, 70 µm, 75 µm, 80 µm, 85 µm, 90 µm, 95 µm, or 100 µm. In yet other examples the thickness of the film is 1, 2, 3, 4, 5 mm, 10 mm, 15 mm, 20 mm, 25 mm, 30 mm, 35 mm, 40 mm, 50 mm, 55 mm, 60 mm, 65 mm, 70 mm, 75 mm, 80 mm, 85 mm, 90 mm, 95 mm, or 100 mm.

In some of the methods described herein, a plurality of particles is deposited onto a substrate using the flash evaporation process. In certain examples, the plurality of particles includes particles having nanodimensioned grains and including Li, a transition metal, and a halide. In certain examples, the transition metal is Cu, Co, Ni, Mn, or Fe. In certain examples, the transition metal is a combination of Cu, Co, Ni, Mn, or Fe. In certain of these examples, the transition metal is Fe. In certain of these examples, the transition metal is Ni. In certain of these examples, the transition metal is Co. In certain of these examples, the transition metal is Cu. In certain of these examples, the transition metal is Co. In certain of these examples, the transition metal is Mn.

Some of the methods described herein include forming a thickness of the first plurality of particles on a substrate member.

In some examples set forth herein, the methods further include forming a thickness of the first plurality of particles a movable substrate member configured on a roll to roll.

In some other examples, the methods set forth herein are such that the first precursor species is an iron or an iron and fluoride species. In certain other examples, the first precursor species is a transition metal or a transition metal and fluoride species, the transition metal being at least one of Fe, Cu, Ni, Co, or Mn. IN some other examples, the second precursor species is a lithium species or a lithium and fluoride species.

In some examples described herein, the methods are such that the plurality of particles are each homogeneous in composition.

In some examples set forth herein, the methods are such that the first nozzle is connected to a first tube structure; and wherein the second nozzle is connected to a second tube structure. In certain examples, the first tube structure is maintained at a temperature of 1000 to 2000 Degrees Celsius. In certain other examples, the second tube structure is maintained at a temperature of 1000 to 2000 Degrees Celsius.

Some of the example methods described herein include using the plurality of first particles for a manufacture of an energy cell.

In some examples set forth herein, the intermixing being provided in a process region at a temperature of about 1000 to 2000 Degrees Celsius. Some examples set forth herein further include subjecting the first plurality of particles to a mechanical process to form a plurality of second particles ranging in diameter from a first diameter to a second diameter.

In some examples set forth herein, the plurality of first particles comprise a lithium, a silicon, a tin, a germanium, a phosphorous, or sulfur species. In certain other examples, the plurality of second particles comprise a lithium, a silicon, a phosphorous, or a sulfur species.

In some of the example methods set forth herein, the first nozzle is fed at a first specified mass flow rate and the second nozzle is fed at a second specific mass flow rate to provide the plurality of first particles at a predetermined stoichiometry. In certain examples, the second nozzle is fed at a specified mass flow rate.

In some examples, disclosed herein is a deposition apparatus for forming a material, the apparatus including: a first source configured for a first precursor species; a second source configured for a second precursor species; a first nozzle coupled to the first source and configured for outputting the first precursor species in a first molecular form; a second nozzle coupled to the second source and configured for outputting the second precursor species in a second molecular form; a process region coupled to the first nozzle and the second nozzle and configured to cause formation of first plurality of particles, ranging from about first diameter to about a second diameter, by intermixing the first precursor species in the first molecular form with the second precursor species in the second molecular form; and a thermal sink provided in the process region, and configured for cooling the first plurality of particles at a rate of greater than 100° C./s to a specified temperature.

In some examples, the apparatus includes the intermixing being provided in the process region. In certain examples, the process region is a vacuum environment or a predetermined environment. In some examples the process region comprises a carrier gas. In yet other examples, the apparatus includes a thermal source configured to subject the first precursor species to a thermal process to preheat the precursor species. In some other examples, the apparatus includes a thermal source configured to subject the second precursor species to a thermal process to preheat the precursor species.

In some examples set forth herein, the apparatus includes a filter process configured to filter the first precursor species. In some other examples, the apparatus includes a filter process configured to filter the second precursor species.

In some other examples, the apparatus is such that that the first nozzle and the second nozzle is formed in a concatenated configuration.

Some examples disclosed herein include an apparatus including a substrate member provided in the process region, the substrate member disposed in the process region for forming a thickness of the first plurality of particles on a substrate member. In certain embodiments, the apparatus includes a movable substrate member disposed in the process region for forming a thickness of the first plurality of particles the movable substrate member configured on a roll to roll.

In some examples, the first precursor species is an iron or an iron and fluoride species. In certain examples the second precursor species is a lithium species or a lithium and fluoride species. In certain other examples, the plurality of particles are each homogeneous in composition.

In some other examples, the first nozzle is connected to a first tube structure; and wherein the second nozzle is connected to a second tube structure. In certain examples, the first tube structure is maintained at a temperature of 1000 to 2000 Degrees Celsius. In certain other examples, the second tube structure is maintained at a temperature of 1000 to 2000 Degrees Celsius. In some of the examples set forth herein, the plurality of first particles is provided for a manufacture of an energy storage cell.

In some other examples, the intermixing is provided in a process region at a temperature of about 1000 to 2000 Degrees Celsius or the intermixing being provided in a process region at a temperature of about 100 Degrees Celsius or less.

Some of the example apparatus described herein include a mechanical process module coupled to the apparatus, the mechanical process module being configured to subject the first plurality of particles to a mechanical process to form a plurality of second particles ranging in diameter from a first diameter to a second diameter.

In certain examples, the plurality of first particles comprise a lithium, a silicon, a tin, a germanium, a phosphorous, or a sulfur species. In other examples, the plurality of first particles comprise a lithium, a silicon, a phosphorous, or a sulfur species. In some of the example apparatus described herein the first nozzle is fed at a specified mass flow rate; and wherein the second nozzle is fed at a specified mass flow rate.

In some examples, disclosed herein is a deposition apparatus for forming a material, the apparatus including a first source configured for a first precursor species; a second source configured for a second precursor species; a nozzle coupled to the first source and the nozzle coupled to the second source; a process region coupled to the nozzle and configured to cause formation of first plurality of particles, ranging from about first diameter to about a second diameter, by an intermixed first precursor species with the second precursor species; and a thermal sink provided in the process region, and configured for cooling the first plurality of particles at a rate of greater than 100° C./s to a specified temperature.

In some examples, the intermixing being provided in the process region or before the nozzle. In some of these examples, the process region is a vacuum environment or a predetermined environment. In certain examples, the process region comprises a carrier gas. In some of these examples, a thermal source is included and is configured to subject the first precursor species to a thermal process to preheat the precursor species. Some of the apparatus included herein include a thermal source configured to subject the second precursor species to a thermal process to preheat the precursor species. Certain of the apparatus included herein include a filter process configured to filter the first precursor species. Certain of the apparatus included herein include a filter process configured to filter the second precursor species. Certain other apparatus included herein are such that the first nozzle and the second nozzle is formed in a concatenated configuration.

Some example apparatus set forth herein include a substrate member provided in the process region, the substrate member disposed in the process region for forming a thickness of the first plurality of particles on a substrate member. Some of these apparatus include a movable substrate member disposed in the process region for forming a thickness of the first plurality of particles the movable substrate member configured on a roll to roll. In some of these examples, the first precursor species is an iron or an iron and fluoride species. In certain other examples, the second precursor species is a lithium species or a lithium and fluoride species. In certain examples, the plurality of particles are each homogeneous in composition. In some examples, the nozzle is connected to a tube structure. In some examples, the tube structure is maintained at a temperature of 1000 to 2000 Degrees Celsius. In other examples, the plurality of second particles is provided for a manufacture of an energy storage cell. In some other examples, the intermixing being provided in a process region at a temperature of about 1000 to 2000 Degrees Celsius or the intermixing being provided in a process region at a temperature of about 100 Degrees Celsius or less or the intermixing being provided before the nozzle.

Some of the example apparatus included herein include a mechanical process module coupled to the apparatus, the mechanical process module being configured to subject the first plurality of particles to a mechanical process to form a plurality of second particles ranging in diameter from a first diameter to a second diameter.

In any of the examples set forth herein, the methods for forming a nanodimensioned material may comprise providing a lithium precursor species; providing a transition metal precursor species; optionally heating the lithium precursor species or the transition metal precursor species, or both, to generate a lithium precursor species vapor, a transition metal precursor species vapor, or both; optionally filtering the lithium precursor species vapor, the transition metal precursor species vapor, or both; transferring through at least one aperture the lithium precursor species vapor into a process region; cooling the lithium precursor species vapor at a rate between about 50° C./s to about 2000° C./S by depositing the vapor on a substrate; transferring through a second aperture the transition metal precursor species vapor into a process region; cooling the transition metal precursor species vapor at a rate between about 50° C./s to about 2000° C./S by depositing the vapor on a substrate; thereby forming a nanodimensioned material.

In any of the examples set forth herein, the methods for forming a nanodimensioned material may comprise providing a lithium precursor species; providing a transition metal precursor species; optionally heating the lithium precursor species or the transition metal precursor species, or both, to generate a lithium precursor species vapor, a transition metal precursor species vapor, or both; optionally filtering the lithium precursor species vapor, the transition metal precursor species vapor, or both; transferring through at least one aperture the lithium precursor species vapor into a process region; cooling the lithium precursor species vapor at a rate greater than 50° C./s by depositing the vapor on a substrate; transferring through a second aperture the transition metal precursor species vapor into a process region; cooling the transition metal precursor species vapor at a rate greater than 50° C./s by depositing the vapor on a substrate; thereby forming a nanodimensioned material.

In any of the examples set forth herein, the methods for forming a nanodimensioned material may comprise providing a lithium precursor species; providing a transition metal precursor species; optionally heating the lithium precursor species or the transition metal precursor species, or both, to generate a lithium precursor species vapor, a transition metal precursor species vapor, or both; optionally filtering the lithium precursor species vapor, the transition metal precursor species vapor, or both; transferring through at least one aperture the lithium precursor species vapor and transition metal precursor species vapor into a process region; intermixing the vapors in the process region to form an intermixture; and cooling the intermixture at a rate greater than 50° C./S by depositing the intermixture on a substrate; thereby forming a nanodimensioned material.

In certain method, the methods also include providing a precursor comprising lithium, silicon, tin, germanium, phosphorous, and/or sulfur precursor species; optionally heating the precursor species to generate a vapor; optionally filtering the precursor species vapor; and transferring through at least one nozzle the precursor species into the process region to be deposited on the deposition surface.

Some examples set forth herein are such that the plurality of first particles comprise a lithium, a silicon, a tin, a germanium, a phosphorous, or a sulfur species. Some of the apparatus described herein are such that the plurality of first particles comprise a lithium, a silicon, a phosphorous, or a sulfur species. In some examples set forth herein, the nozzle is fed at a specified mass flow rate.

In any of the methods set forth herein, the deposited material may be subsequently used as it is deposited, e.g., on a foil substrate, or a powder of the deposited material may be removed from a deposition substrate, e.g., a rotating drum, and used as a powder.

In some examples, the materials made by the methods set forth herein are also characterized by a crystalline character. For example, some TEM images of these materials, made by some examples set forth herein, demonstrate some crystallinity in $FeF_2$, e.g., the SAED patterns show some crystallinity.

While the above is a full description of the specific embodiments, various modifications, alternative constructions and equivalents may be used. That is, the above description can be applied to other elements such as an electrolyte or others. Therefore, the above description and illustrations should not be taken as limiting the scope of the present invention which is defined by the appended claims.

The invention claimed is:

1. A method for forming a nanodimensioned material, the method comprising:
   providing a lithium precursor species;
   providing a transition metal precursor species;
   wherein the said precursor species are precursor powders;
   heating the lithium precursor species or the transition metal precursor species, or both, at a temperature in the range of 1000° C. to 2500° C., to generate a lithium precursor species vapor, a transition metal precursor species vapor, or both;
   optionally filtering the lithium precursor species vapor, the transition metal precursor species vapor, or both;
   transferring through at least one aperture the lithium precursor species vapor and transition metal precursor species vapor into a process region;
   intermixing the vapors in the process region to form an intermixture;
   and cooling the intermixture at a rate between about 100° C./s to about 2000° C./s by depositing the intermixture on a substrate by a thermal deposition process;
   thereby forming a nanodimensioned material.

2. The method of claim 1, wherein providing both precursor species is under vacuum or a reduced pressure atmosphere.

3. The method of claim 1, comprising independently transferring each precursor species vapors through one of two apertures.

4. The method of claim 1, comprising filtering the lithium precursor species vapor, the transition metal precursor species vapor, or both
   wherein filtering comprises heating the precursor species so that only a vapor of the precursor species is transferred through the filter and into the process region.

5. The method of claim 1, wherein the nanodimensioned material is in a substantially amorphous state.

6. The method of claim 1, comprising flowing a carrier gas through the process region.

7. The method of claim 1, comprising filtering the lithium precursor species prior to the transferring step.

8. The method of claim 1, comprising transferring each precursor species vapors through one of two apertures which are in a concatenated configuration.

9. The method of claim 1, comprising transferring each precursor species vapors through one of two apertures which are in a concentric configuration.

10. The method of claim 1, wherein the lithium precursor species is lithium fluoride.

11. The method of claim 1, wherein the transition metal precursor species is selected from $FeF_2$, $FeF_3$, or Fe.

12. The method of claim 1, wherein the substrate is selected from a rotating drum or a foil on a roll to roll mechanism.

13. The method of claim 1, wherein the transition metal precursor species is an iron or an iron and fluoride species.

14. The method of claim 1, wherein the lithium precursor species is a lithium species or a lithium and fluoride species.

15. The method of claim 1, wherein the substrate is an aluminum or Cu drum that is actively cooled.

16. A deposition apparatus for forming a nanodimensioned material, the apparatus comprising:
    a source of a lithium precursor species;
    a source of a transition metal precursor species;
    wherein the said precursor species are precursor powders;
    at least one aperture coupled to the lithium precursor source and the transition metal precursor source and configured for outputting the lithium precursor species or the transition metal precursor species, or both, in a vapor form into a process region;
    a process region coupled to the at least one or more apertures and configured to intermix the precursor species; and
    a thermal deposition process sink provided in the process region for cooling the vapors in the process region at a rate between about 100° C./s to about 2000° C./s.

17. The apparatus of claim 16, wherein the thermal deposition process sink is selected from a rotating drum or a foil on a roll to roll mechanism.

18. The apparatus of claim 16, wherein the thermal deposition process sink is actively cooled.

19. The apparatus of claim 16, further comprising a thermal source to heat the precursor species by inductive or resistive heating.

20. The apparatus of claim 16, further comprising a filter to filter vapors of the precursor species.

21. The apparatus of claim 16, comprising two apertures formed in a concatenated configuration.

22. The apparatus of claim 16, wherein the thermal deposition process sink is a movable member selected from a rotating drum or a foil on a roll to roll mechanism.

23. The apparatus of claim 16, wherein the transition metal precursor species is an iron or an iron and fluoride species.

24. The apparatus of claim 16, wherein the lithium precursor species is a lithium species or a lithium and fluoride species.

25. The apparatus of claim 16, wherein the source of a lithium precursor species is maintained at a temperature of 1000 to 2000° C.

26. The apparatus of claim 16, wherein the source of a transition metal species is maintained at a temperature of 1000 to 2000° C.

27. The apparatus of claim 16, further comprising a source of a lithium, a silicon, a tin, a germanium, a phosphorous, or a sulfur species.

28. The apparatus of claim 16, wherein the process region is maintained at a temperature of about 300 to 2500° C.

29. The apparatus of claim 16, wherein the process region is maintained at a temperature of about 1000 to 2500° C.

30. The apparatus of claim 16, wherein the process region is maintained at a temperature of about 1000 to 2000° C.

* * * * *